United States Patent [19]

English

[11] Patent Number: 5,517,157
[45] Date of Patent: May 14, 1996

[54] EVANESCENT-FIELD INTERROGATOR FOR ATOMIC FREQUENCY STANDARDS

[75] Inventor: Thomas C. English, Costa Mesa, Calif.

[73] Assignee: Ball Corporation, Muncie, Ind.

[21] Appl. No.: 52,969

[22] Filed: Apr. 27, 1993

[51] Int. Cl.⁶ ........................................................ H03L 7/26
[52] U.S. Cl. ................................................ 331/94.1; 331/3
[58] Field of Search ........................................ 331/94.1, 3

[56] References Cited

U.S. PATENT DOCUMENTS

| | | | |
|---|---|---|---|
| 3,129,389 | 4/1964 | Packard et al. | 331/3 |
| 3,192,472 | 6/1965 | Bender et al. | 324/58.5 |
| 3,382,452 | 5/1968 | Rempel et al. | 331/3 |
| 3,390,350 | 6/1968 | Davidovits et al. | 331/94 |
| 3,403,349 | 9/1968 | Wieder | 330/4.3 |
| 3,513,381 | 5/1970 | Happer, Jr. | 324/5 |
| 3,798,565 | 3/1974 | Jechart | 331/94 |
| 3,903,481 | 9/1975 | Jechart | 331/3 |
| 4,121,178 | 10/1978 | Schlossberg | 372/32 |
| 4,349,798 | 9/1982 | Podell et al. | 333/230 |
| 4,405,905 | 9/1983 | Busca et al. | 331/94.1 |
| 4,494,085 | 1/1985 | Goldberg | 331/94.1 |
| 4,495,478 | 1/1985 | Kwon et al. | 333/230 |
| 4,947,137 | 8/1990 | Busca et al. | 331/94.1 |
| 5,327,105 | 7/1994 | Liberman et al. | 331/94.1 |

FOREIGN PATENT DOCUMENTS

| | | |
|---|---|---|
| 52-19096 | 2/1977 | Japan . |
| 2067751 | 7/1981 | United Kingdom . |

OTHER PUBLICATIONS

Busca et al., "Long-term Frequency Stabilization of the $Rb^{87}$ Maser," 24 IEEE Transactions on Instrumentation and Measurement 291–96 (Dec. 1975).

Matsuda et al. "Signal Intensity Characteristics of the $^{87}Rb$ Double Resonance Due to the Pumping Light", Japanese J. of Appl. Physics, vol. 16, No. 3, Mar. 1977, pp. 391–396.

Kuramochi et al., "Composite–type $^{87}Rb$ Optical–Pumping Light Source", Optics Letters, vol. 6, No. 2, Feb. 1981, pp. 73–75.

Audoin et al., "Atomic Frequency Standards and Clocks", J. of Physics E. Scienfitic Instruments, vol. 9, No. 9 (1976.09), pp. 697–720.

Mathur et al., "Light Shifts in the Alkali Atoms" Physical Review, vol. 171, No. 1, 5 Jul. 1968, pp. 11–19.

Eltsufin, Stern, and Fel, "Compact Rectangular–Cylindrical Cavity for Rubidium Frequency Standard," IEEE Forty––Fifth Annual Symposium on Frequency Control, 1991, pp. 567–571.

Primary Examiner—Andrew M. Dolinar
Attorney, Agent, or Firm—Willian Brinks Hofer Gilson & Lione

[57] ABSTRACT

A novel atomic frequency standard includes an absorption cell containing a first volume of atoms for varying an intensity of light energy passing therethrough; at least one dielectric resonator for generating an evanescent electromagnetic field that effects hyperfine energy level transitions of the first volume of atoms; a waveguide for housing the absorption cell and one or more dielectric resonator(s); a photo detector mounted near an end of the waveguide for receiving light energy; and an electromagnetic energy injector for electromagnetically exciting the dielectric resonator(s). Preferably, a filter cell is positioned adjacent to a dielectric resonator between the absorption cell and the light source. Tuning of the resonant frequency of the dielectric resonator(s) can be accomplished by adjusting the distance between the filter cell and the adjacent dielectric resonator, and can also be accomplished by positioning a dielectric tuning disk adjacent a dielectric resonator, and adjusting the distance between the dielectric resonator and the dielectric tuning disk.

78 Claims, 13 Drawing Sheets

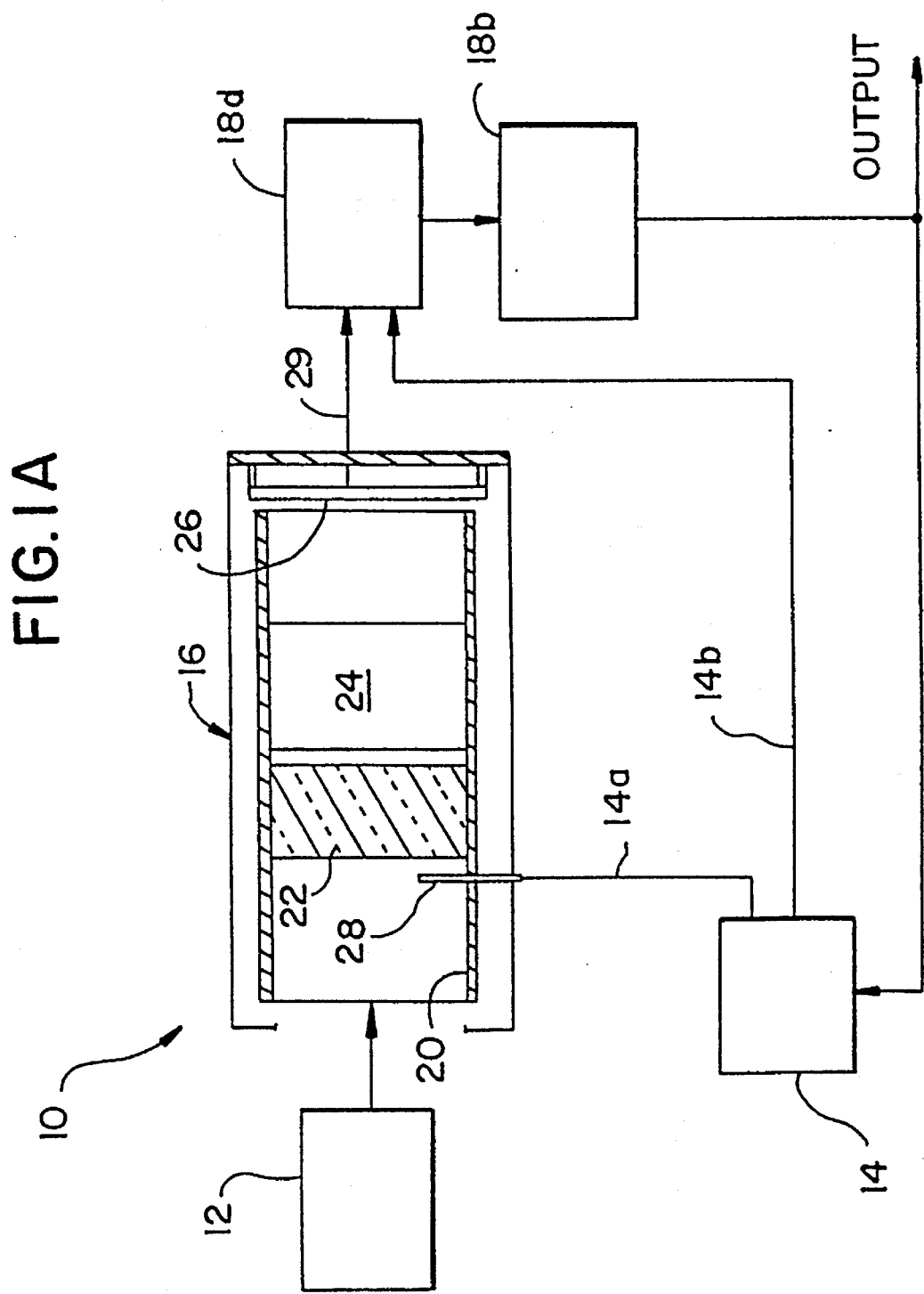

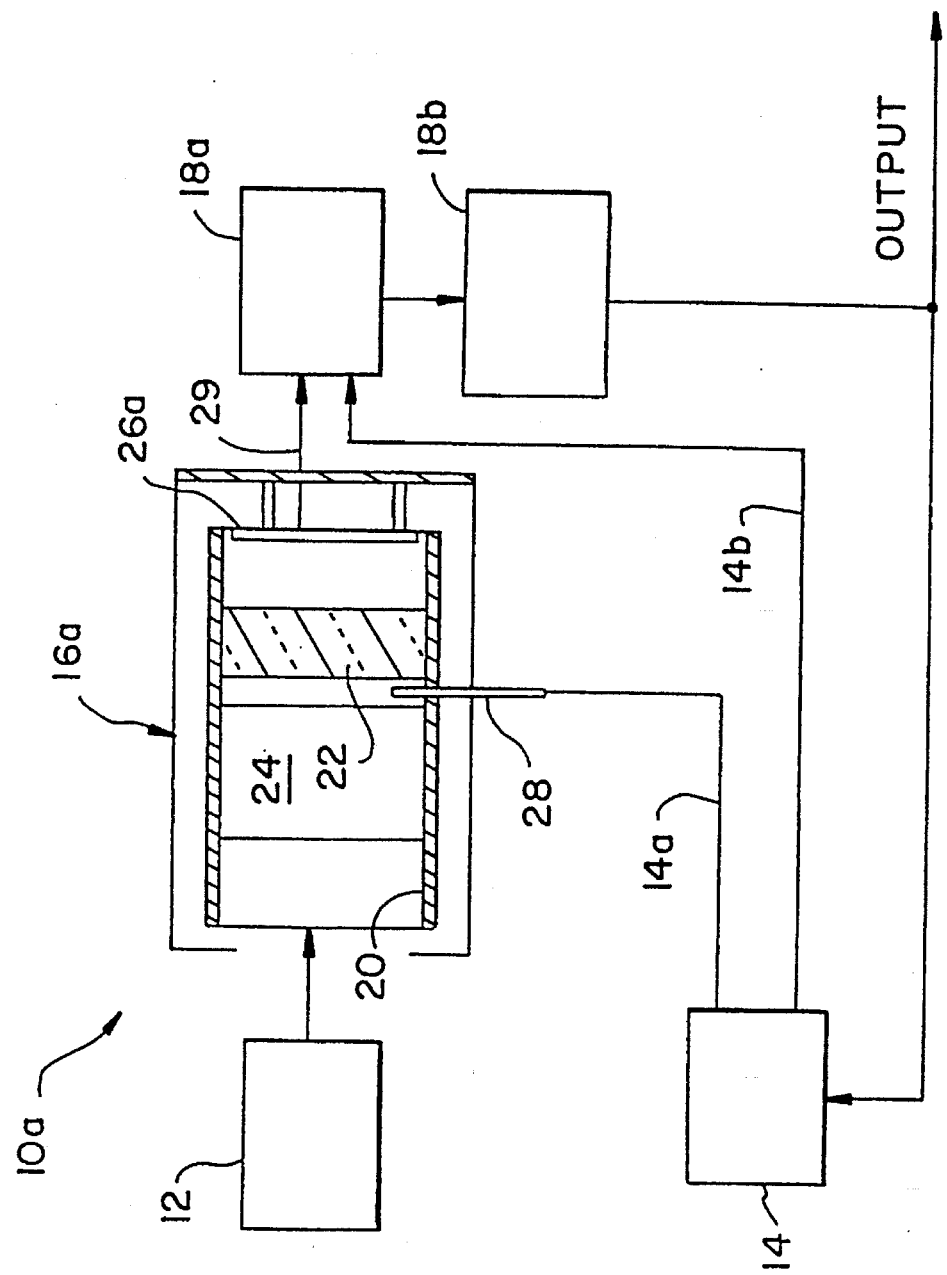

EVANESCENT-FIELD INTERROGATOR FOR ATOMIC FREQUENCY STANDARDS

FIELD OF THE INVENTION

The present invention relates to frequency standards and more particularly to optically-pumped atomic frequency standards.

BACKGROUND OF THE INVENTION

An atomic frequency standard is a device having a resonant system derived from an atomic or molecular specie experiencing a transition between two or more well-defined energy levels of the atom or molecule.

For example, the two lowest energy levels of the rubidium atom (Rb) are known as the ground state hyperfine energy levels A and B. When atoms of gaseous Rb-87 at levels A and B are irradiated with microwave energy at a precise "transition frequency", corresponding to the rubidium frequency that causes atom transitions between the hyperfine energy levels, the rubidium atoms at hyperfine energy level A will make the transition to level B, and vice versa. The transition is employed as a highly accurate frequency reference to which the frequency of a quartz crystal oscillator or voltage-controlled crystal oscillator (VCXO) can be electronically locked in creating an atomic frequency standard.

In such atomic-controlled oscillators the frequency of a quartz crystal oscillator is controlled by means of a physics package and associated electronics that are devoted to maintaining the assigned output frequency, typically 5 MHz or 10 MHz, on a very long-term, exceedingly accurate and stable basis. By properly slaving the quartz crystal oscillator to the frequency of the atomic transition in the physics package, the tendency of the quartz crystal to exhibit drifting due to aging and other inherent as well as environmental effects is markedly suppressed. The physics package of a typical atomic frequency standard generally includes a microwave cavity resonator, an isotopic filter cell, an absorption cell, a light source, a photo detector, temperature control means, and at least one magnetic shield surrounding these components.

In such a typical rubidium atomic frequency standard, for example, the light source is a glass bulb containing rubidium atoms which produces light by an rf-excited plasma discharge. The rubidium in the lamp is heated to a vapor state, approximately 110° C., and is subjected to a high-energy rf field, thereby generating light from the excited rubidium atoms. The "rubidium light" is directed through a filter cell which contains an isotope of rubidium, such as Rb-85, which filters out light with a wavelength that will stimulate transition of atoms from the hyperfine energy level B to any optically-excited level C. The filtered rubidium light is then directed through an absorption cell, also called a resonance cell. The absorption cell includes another isotope of rubidium, Rb-87, and the filtered light energy absorbed by the Rb-87 atoms at hyperfine energy level A causes a transition of the Rb-87 atoms from level A to any optically-excited energy level C. The atoms excited to energy level C, however, do not remain at level C for more than tens of nanoseconds, but return to ground state hyperfine levels A and B in approximately equal numbers by either spontaneous emission of light and/or by collisions, including collisions with other atoms, molecules, or the walls of the absorption cell. Since the filtered light does not allow transitions of atoms from level B to level C, the continuing cycle of optical excitation of atoms from level A to level C and the redistribution of atoms falling from level C between levels A and B eventually results in few, if any, atoms at level A for excitation to level C, and little or no absorption of the light passing through the absorption cell because the atoms have accumulated at hyperfine energy level B. The atoms at level A are said to have been "optically pumped" to level B. If, however, microwave energy is applied to the absorption cell at the rubidium transition frequency, transitions of atoms between hyperfine levels A and B occur, reintroducing atoms at level A which again absorb light energy and undergo a subsequent transition to level C and thereby reduce the light passing through the absorption cell.

The rubidium light passing through the absorption cell is incident on a photo detector, which produces a current output which is proportional to the intensity of the incident light. The current output is processed by servo electronics to provide a control voltage to a voltage controlled crystal oscillator (VCXO) whose output is multiplied (and synthesized) to the rubidium transition frequency and provides the microwave energy used to cause the transitions between hyperfine levels A and B. When the frequency of the microwave energy corresponds to the hyperfine transition frequency, 6.834 GHz for Rb-87, maximum light absorption occurs and the current output of the photo detector is reduced. If, however, the frequency of the microwave energy does not correspond to the hyperfine frequency, then more light will pass through the absorption cell to the photo detector, which in turn increases its current output. Thus, the photo detector current output can be used to provide an error signal to maintain the output frequency of the VCXO, typically 5 or 10 MHz, (which, as noted above, is multiplied and synthesized to produce the hyperfine transition frequency of the rubidium atoms), thereby creating an extremely stable 5 or 10 MHz output frequency standard.

It should be noted in passing that level A is actually three levels, all having the same energy, and level B is actually five levels all having the same energy, but different than the energy of the level A atoms by the hyperfine-energy-level difference. In practice a small static magnetic field (the "C-field" ≈0.3 Gauss) is applied to the Rb-87 atoms to slightly separate the A levels, and also to slightly separate the B levels. It is well known in the art that microwave energy supplied at the appropriate frequency to an absorption cell containing Rb-87 atoms causes an atomic, or "clock" transition at 6.834 GHz to occur from the single B level with quantum numbers (F=2, $M_F$ =0) to the single A level with quantum numbers (F= 1, $M_F$=0).

Over the years there have been substantial efforts by workers in the field to modify the physics package in order to reduce its overall physical dimensions without changing its operational characteristics.

For example, U.S. Pat. No. 3,903,481 discloses an early development made to reduce the overall size for rubidium vapor frequency standards by eliminating from the physics package one of its elements, the filter cell, that was used to remove one of the hyperfine light frequencies emitted by the light source. This was accomplished by combining the filter cell function with an associated absorption cell function. Thus, the filtering atoms, generally the isotope of rubidium Rb-85, and a buffer gas, were incorporated directly into the absorption cell containing another isotope of rubidium, Rb-87. Therefore, the absorption cell performed dual roles, acting not only as an optically pumped absorption cell to create a population difference for Rb-87 atoms, but, also as a filter cell to avoid unwanted transitions. By combining these two functions within a single cell the physics package was reduced in size.

Other efforts have focused, at least in part, on the excitation of Rb-87 atoms. U.S. Pat. No. 4,405,905 discloses an atomic frequency standard having a microwave loop around the absorption cell. The microwave loop is used to excite Rb-87 atoms contained in an evacuated, wall-coated rubidium absorption cell.

U.S. Pat. No. 4,947,137 discloses a passive atomic frequency standard for interrogating atoms excited by a helical resonator structure, resonant at 6.8 GHz, bonded to the cylindrical surface of the absorption cell.

U.S. Pat. No. 4,494,085 discloses a miniature optical package for an atomic frequency standard having both a filter cell and an absorption cell in the microwave cavity. By positioning the windows of the filter cell and absorption cell all centrally within the microwave cavity, the cavity may be dielectrically loaded and reduced in size. In addition, a Fresnel collimating lens may be placed between the windows of the filter cell and absorption cell and may provide additional dielectric loading of the microwave cavity.

SUMMARY OF THE INVENTION

The present invention relates to a method and an apparatus of substantially reduced size for generating a resonant evanescent electromagnetic field for interrogating atoms to effect hyperfine energy level transitions of the atoms, and further relates to a method for tuning the resonant frequency of the evanescent electromagnetic field. Such a novel atomic frequency standard comprises a light source for supplying light energy; an absorption cell containing a first volume of atoms for varying an intensity of the light energy passing therethrough; a dielectric resonator for generating an evanescent electromagnetic field that effects hyperfine energy level transitions of the first volume of atoms; a waveguide housing the absorption cell and the dielectric resonator; a photo detector mounted near an end of the waveguide for receiving the light energy; and an electromagnetic injector for electromagnetically exciting the dielectric resonator. Preferably, the first volume of atoms comprises one element of a group consisting of alkali-metals, such as isotopes Rb-87 or Cs-133. Preferably, the dielectric resonator is a disk of dielectric material, such as Corning 8161 glass. Preferably, the dielectric resonator has a Q greater than or equal to 100. The dimensions of the dielectric resonator are selected to create an initial resonant frequency, such as 6.840 GHz, of the dielectric resonator.

In a preferred embodiment, the dielectric resonator is positioned between the absorption cell and the filter cell, and the distance between the dielectric resonator and the filter cell is varied to affect the resonance of the dielectric resonator, thus providing adjustable tuning for the resonant frequency of the dielectric resonator. In embodiments which do not include a filter cell, however, tuning of the resonant frequency of the dielectric resonator can be achieved by positioning a tuning dielectric disk adjacent to the dielectric resonator and varying the distance between the dielectric resonator and the tuning dielectric disk.

In another embodiment, a first dielectric resonator and a second dielectric resonator are positioned adjacent to opposite sides of the absorption cell for generating the evanescent electromagnetic field. Each of the first and second dielectric resonators is a dielectric material transparent to the useful light from the light source, and preferably has a Q greater than or equal to 100.

In other embodiments, the absorption cell and the dielectric resonator are combined to form an integral unit by positioning and using a glass dielectric resonator to also form a window of the absorption cell. The integral unit can further contain atoms to provide optical filtering of the light energy. In another embodiment, the filter cell and the absorption cell are combined to form a unitary, or "integrated", cell containing a mixture of Rb-85 atoms and Rb-87 atoms.

Preferably, the waveguide comprises a cylindrical tube electrically open-ended on at least one end and having a conductive inner surface, or a solid copper tube. The waveguide can further include a heating device for heating the filter cell and/or the absorption cell to a temperature sufficient to provide an adequate vapor density of the substance contained therein.

A method for generating a standard frequency, includes the steps of: providing a volume of atoms capable of having a plurality of hyperfine energy levels; generating light energy and directing the light energy to the volume of atoms; exciting a dielectric resonator; generating an evanescent electromagnetic field with the excited dielectric resonator; introducing the evanescent electromagnetic field into the volume of atoms causing hyperfine energy level transition of atoms to affect an intensity of light energy directed at and transmitted through the volume of atoms; and effecting a current output of a photo detector in relation to the intensity of the transmitted light energy. Preferably, the exciting step further comprises the steps of supplying the current output from the photo detector to a voltage controlled crystal oscillator via a servo electronics package and generating an output signal by the voltage controlled crystal oscillator to effect the excitation of the dielectric resonator. The method can also include the step of filtering the light energy for passing a predetermined frequency or frequencies of the light energy. If, however, a laser is used as the light source, the step of filtering the light energy may be unnecessary.

In the operation of the invention, the evanescent electromagnetic field that is generated by excitation of the dielectric resonator(s) oscillates at a resonant frequency of the dielectric resonator(s), which is approximately equal to an atomic transition frequency, such as that of the Rb-87 atom, approximately 6.834 GHz. The evanescent electromagnetic field penetrates the absorption cell to effect hyperfine energy level transitions of the first volume of atoms in the absorption cell.

A method of tuning a resonant frequency of an electromagnetic field generated in an atomic frequency standard includes the steps of: providing a dielectric resonator adjacent to a volume of atoms to cause the volume of atoms to undergo hyperfine energy level transitions; positioning the dielectric resonator between the volume of atoms and a filter cell; and adjusting the distance between the dielectric resonator and the filter cell to adjust the resonant frequency of the dielectric resonator.

Another method of tuning a resonant frequency of an electromagnetic field generated in an atomic frequency standard includes the steps of providing an excited dielectric resonator adjacent to a volume of atoms to cause the volume of atoms to undergo hyperfine energy level transitions; positioning the dielectric resonator between the volume of atoms and a dielectric disk; and adjusting the distance between the dielectric resonator and the dielectric disk to adjust the resonant frequency of the dielectric resonator.

Systems having two dielectric resonators can be tuned by positioning a dielectric tuning disk adjacent one or each of the dielectric resonators and adjusting the distance between the dielectric tuning disk and the adjacent dielectric resonator. Also, such systems may include one dielectric tuning disk adjacent one of the dielectric resonators and a filter cell positioned adjacent the other of the dielectric resonators, in which case tuning can be effected by moving the dielectric tuning disk, the filter cell, or both, along the optical axis and with respect to the adjacent dielectric resonator.

Other features and advantages of the invention may be determined from the drawings and the detailed description of the invention that follow.

BRIEF DESCRIPTION OF THE DRAWINGS

FIG. 1A shows a simplified sectional diagrammatic representation of an atomic frequency standard embodying the present invention.

FIG. 1B shows an alternative configuration for the optical physics package of the atomic frequency standard of FIG. 1A.

DETAILED DESCRIPTION OF THE PREFERRED EMBODIMENTS

Figure 2:
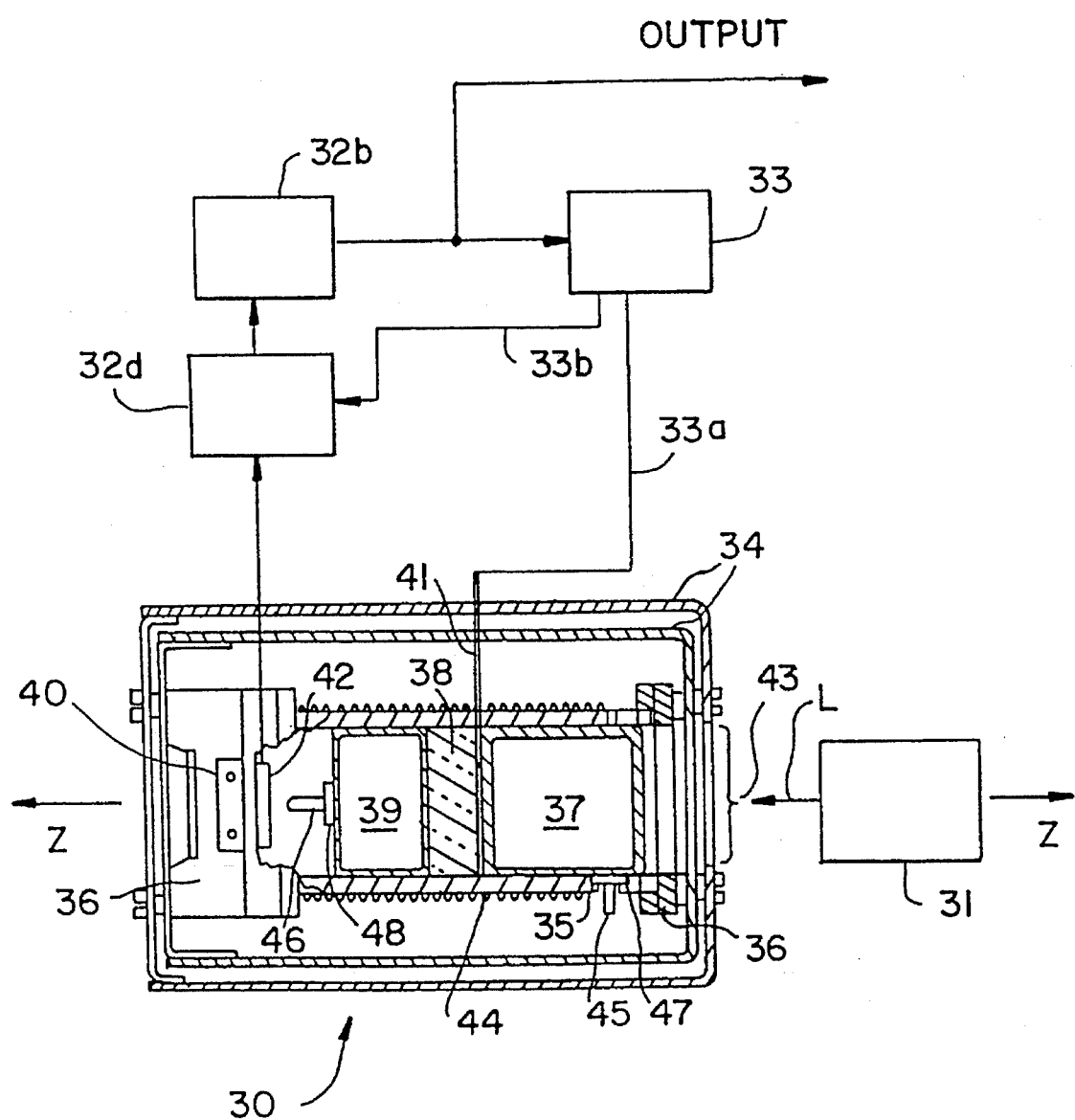
FIG. 2 shows a sectional diagrammatic drawing of an embodiment of the invention with a portion of the waveguide and waveguide support broken away.

FIG. 1A shows a simplified representation of an atomic frequency standard 10 embodying the present invention. Atomic frequency standard 10 includes a light source 12, a frequency multiplier-synthesizer 14, an optical physics package 16, a servo electronics package 18a, and a voltage controlled crystal oscillator (VCXO) 18b. Optical physics package 16 includes a waveguide 20 which houses a resonant dielectric device, such as dielectric resonator 22, and an absorption cell 24 containing a volume of atoms, such as Rb-87. A photo detector 26 is mounted, for convenience, near an end of waveguide 20 opposite the light source 12.

Dielectric resonator 22 is a disk of low loss dielectric material (e.g. Q>100) that is transparent to the light frequency or frequencies useful in optically effecting energy level transitions of atoms in the absorption cell 24 and, thus, is transparent to the useful light radiated from light source 12. Dielectric resonator 22 is dimensioned to be resonant at about the transition frequency of the atoms in absorption cell 24. Dielectric resonator 22 is housed within a short section of open-ended waveguide 20, which operates below the cutoff frequency at the transition frequency of the atoms in absorption cell 24. In the invention, dielectric resonator 22 and waveguide 20 cooperate to provide an evanescent electromagnetic field extending within absorption cell 24 to eliminate the need for a conventional microwave cavity and to provide a very small atomic interrogator for an atomic frequency standard that can be economically manufactured.

In operation of such an atomic frequency standard, light source 12 supplies light energy to optical physics package 16. Photo detector 26 in turn generates an output signal indicative of the light energy transmitted through the absorption cell and received by the photo detector 26. The signal generated by photo detector 26 is supplied via servo electronics package 18a to VCXO 18b. The VCXO 18b generates an output signal with a frequency of typically 1, 5, 10, or 20 MHz, or higher, which is supplied to frequency multiplier-synthesizer 14. Multiplier-synthesizer 14 multiplies the VCXO signal to generate an atomic transition frequency output signal 14a which is supplied to an electromagnetic energy injector probe, or E-field probe, 28 and used to excite dielectric resonator 22. One method of generating the Rb-87 atom's hyperfine energy level transition frequency of approximately 6834.7 MHz from a 10 MHz signal is to multiply the 10 MHz signal by 684, and then subtract therefrom a 5.3 MHz signal synthesized from the 10 MHz signal. Thus, (10 MHz * 684) −5.3 MHz=6834.7 MHz, the hyperfine energy level transition frequency for Rb-87 atoms. Dielectric resonator 22 is designed and tuned to be resonant at about 6834 MHz and the excited dielectric resonator 22 generates an evanescent electromagnetic field which extends into the absorption cell 24 and excites atoms in absorption cell 24 to effect transitions of atoms between hyperfine energy levels A and B.

Multiplier-synthesizer 14 also includes electronic circuitry for generating a low-frequency modulation signal, typically about 100 Hz, and uses it to internally phase modulate the 6.834 GHz signal before injection into optical physics package 16. The phase modulated 6.834 GHz signal injected into physics package 16 causes dielectric resonator 22 to generate a modulated evanescent field. The modulated evanescent field interrogates atoms in absorption cell 24 to vary the intensity of light arriving at photo detector 26. Photo detector 26 generates an alternating current (ac) output signal which is subsequently processed by servo electronics package 18a. To assist in this processing, modulation signal 14b is also supplied from multiplier-synthesizer 14 to servo electronics package 18a where it is used to synchronously demodulate the ac signal derived from photo detector 26, thereby providing the direct current (dc) error voltage to control the frequency of VCXO 18b.

Light source 12 can comprise an omnidirectional rubidium lamp containing a mixture of Rb-85 and Rb-87 atoms which are excited into a radiating plasma source of incoherent light energy or can comprise a laser source of coherent light energy. The light energy radiated from light source 12 is collected at the open end of waveguide 20 near light source 12 and arrives at photo detector 26 after traversing dielectric resonator 22 and absorption cell 24. Assuming the rubidium lamp is used, when the Rb-87 atoms in light source 12 are excited into a radiating plasma using, for example, radio-frequency radiation at approximately 100 MHz, the Rb-87 atoms emit light having a spectrum containing two strong optical lines of Rb-87 ($D_1$ at 794.8 nm and $D_2$ at 780.0 nm), each of which contains two main hyperfine components. The absorption cell 24 shown in FIG. 1A is one containing a buffer gas and a volume of alkali metal atoms and, more particularly, a volume of Rb-87 atoms, or a combination of Rb-85 and Rb-87 atoms. A beam of such light from the rubidium lamp traversing the absorption cell 24 causes the preferential absorption of one of the hyperfine components for both $D_1$ and $D_2$ optical spectrum lines. The remaining $D_1$ and $D_2$ spectral components serve as optical pumping light and bring about a population difference between the two ground state hyperfine levels of Rb-87 in the absorption cell 24. Preferably, only those atoms that are in the lower hyperfine state, level A, absorb the optical pumping light and are raised to the optically-excited high energy state, level C. Furthermore, by spontaneous emission and buffer gas collisions, such atoms return approximately equally divided in quantity to the two ground hyperfine states A and B. The number of atoms able to absorb the optical pumping light at level A become fewer in number as this process continues, and absorption cell 24 tends to become more transparent to the light, and the intensity of the light energy reaching photo detector 26 increases.

Microwave energy from the multiplier-synthesizer 14 is coupled to dielectric resonator 22, for example, by supplying electromagnetic energy to E-field probe 28 as shown in FIG. 1A, by using a magnetic coupling loop, or by using other energy transfer means well known in the art. Although E-field probe 28 must be positioned in close proximity to dielectric resonator 22, the exact location of the probe positioned close to dielectric resonator 22 is not critical and it is not intended that the invention be limited to the exact E-field probe location shown in FIG. 1A. The electromagnetic energy injected into dielectric resonator 22 causes dielectric resonator 22 to generate an evanescent electromagnetic field oscillating at a resonant frequency of dielectric resonator 22, which, for a rubidium device, is ideally approximately 6.834 GHz, the rubidium frequency corresponding to the energy gap between the two ground state hyperfine levels A and B. The energy E, required to effect a hyperfine transition of atoms is related to the transition frequency, f, of the atoms by the equation $E=hf$, wherein h is Planck's constant. Waveguide 20 contains and defines the evanescent electromagnetic field generated by dielectric resonator 22 and supplied to absorption cell 24. The evanescent electromagnetic field from dielectric resonator 22 produces a population increase of atoms in the lower hyperfine energy level A by causing hyperfine energy level transitions of atoms between level B and level A. The atoms that arrive at the lower energy level A absorb light energy and are optically pumped and raised to higher energy level C by the light energy supplied by light source 12. This absorption of light energy in turn causes a reduction in the light energy which reaches photo detector 26, and when there is less light reaching photo detector 26, there is a corresponding reduction in the output current produced by the photo detector 26. Thus, when the microwave frequency is equal to the sharply and precisely defined rubidium transition frequency of 6.834 GHz, the current output 29 of photo detector 26 is at its minimum.

The current output 29 of photo detector 26 is then converted electronically by the servo electronics package 18a to an error signal having amplitude and phase information that is used to maintain the signal output of VCXO 18b at the desired VCXO output signal frequency of 5 MHz or 10 MHz. As noted above, the VCXO signal is multiplied and synthesized by frequency multiplier-synthesizer 14 to produce the microwave signal of 6.834 GHz, which is used to electromagnetically excite dielectric resonator 22 to cause dielectric resonator 22 to generate the evanescent electromagnetic field oscillating at 6.834 GHz. The frequency output of VCXO 18b can thus be locked to the stable atomic transition frequency of rubidium.

Thus, by using the apparatus and method described above, VCXO 18b can operate at exactly 5 or 10 MHz because the resonant frequency of the microwaves fed to dielectric resonator 22 will be exactly equal to the frequency of the rubidium transition.

FIG. 1B shows an alternative configuration for the optical physics package of the atomic frequency standard 10 of FIG. 1A. In FIG. 1B, an atomic frequency standard 10a includes an optical physics package 16a having dielectric resonator 22 positioned in waveguide 20 between absorption cell 24 and a photo detector 26a. Photo detector 26a is mounted to a rear surface of optical physics package 16a and extends slightly into the open area in waveguide 20. E-field probe 28 is shown positioned between dielectric resonator 22 and absorption cell 24, however, the exact location of E-field probe 28 is not critical to the invention, provided that E-field probe 28 is positioned near dielectric resonator 22. In view of the component arrangement of FIG. 1B, optical physics package 16a can be constructed smaller and more compactly than optical physics package 16 of FIG. 1A.

The overall operation of optical physics package 16a is substantially similar to the operation of optical physics package 16 of FIG. 1A, and the individual elements comprising the two systems are substantially equivalent. The performances of the two optical physics packages 16 and 16a, however, are not necessarily equivalent. The primary difference between the performances of the optical physics packages 16 and 16a of FIGS. 1A and 1B, respectively, is that in optical physics package 16a of FIG. 1B, the positioning of dielectric resonator 22 near photo detector 26a results in a system Q significantly less than the Q of dielectric resonator 22, and the system Q can be as small as 50 or even less. The actual system Q of optical physics package 16a will be inversely related to the distance between dielectric resonator 22 and photo detector 26a, but will not be larger than the inherent Q of the dielectric material comprising dielectric resonator 22. To compensate for the lower system Q of optical physics package 16a of FIG. 1B and achieve system performance substantially equal to optical physics package 16 of FIG. 1A, it is necessary to increase the amount of electromagnetic energy supplied to E-field probe 28 of FIG. 1B.

The embodiment of the invention shown in FIG. 2 includes an optical physics package 30 having a separate filter cell 37, a light source 31, a servo electronics package 32a, a VCXO 32b, and a multiplier-synthesizer 33 to provide microwave energy at an atom transition frequency. Physics package 30 includes a pair of magnetic shields 34 positioned around a waveguide 35, waveguide supports 36, filter cell 37, a dielectric resonator disk 38, an absorption cell 39, a heater transistor 40, an E-field probe 41, a photo cell 42 and a C-field coil 44. Magnetic shields 34 are formed from material having a high magnetic permeability, such as a nickel steel alloy containing about 17 to 20 percent iron, about 5 percent copper and low percentage of manganese or chromium, or other ferromagnetic compositions, to provide effective shielding from the earth's magnetic fields and from any other source of magnetic fields. Mounted to magnetic shields 34 are waveguide supports 36. Waveguide supports 36 are preferably formed from a thermally insulating material, such as polyamide fiberglass. Waveguide supports 36 mount waveguide 35 within resonator package 30.

Waveguide 35 is preferably a cylindrical tube electrically open-ended on at least one end and having an electrically conductive, preferably metallic inner surface, or a solid copper tube, and having a circular cross section dimensioned to provide operation below the cutoff frequency at the atomic transition frequency in use. An "electrically open-ended" waveguide can be any means for carrying the dielectric resonator and providing an electrically conductive surface for definition and substantial containment of the evanescent field generated by the dielectric resonator without a substantial escape of electromagnetic energy, and can be, for example, any waveguide extending from the dielectric resonator at least about 2.5 decay lengths of the evanescent field along the waveguide axis, Z, including dielectric housings with variously shaped tubular cross-sections provided with electrically conductive interior surfaces extending from the dielectric resonator on the order of about 2.5 decay lengths (but not necessarily to the ends of the dielectric housings), and, preferably, open-ended metallic tubular housings at least about 5 decay lengths long and any other optically-open functional waveguide equivalent. The decay length is the distance required for the amplitude of the evanescent field to decrease exponentially to 37% of its starting value at the surface of the resonator disk.

Although waveguide 35 is electrically open-ended, waveguide 35 can be covered at its open end(s) by a covering that is substantially transparent, such as MYLAR®, sapphire or glass, to reduce temperature gradients in filter cell 37 and absorption cell 39. Covering an open end of the waveguide 35 with a substantially transparent cover will not substantially affect the performance of optical physics package 30 provided that the evanescent field has sufficiently decayed prior to reaching the electrically open end so that no substantial amount of the evanescent field escapes from the waveguide.

Fixedly positioned inside waveguide 35 are filter cell 37, dielectric resonator disk 38 and absorption cell 39.

Dielectric resonator disk 38 may be a small circular disk of low loss glass material such as Corning 8161 glass, which has a quality factor in excess of 100 at the atomic hyperfine energy level transition frequency. In a passive rubidium atomic standard, with an atomic transition frequency of 6834.7 MHz, the waveguide 35 can have an inside diameter of about 0.525 inches (about 1.33 cm), and the dielectric disk can have an outside diameter of about 0.520 inches (about 1.32 cm) and a thickness of about 0.127 inches (about 3.23 mm).

Filter cell 37 and absorption cell 39 each contain a volume of alkali-metal atoms. In a rubidium standard, filter cell 37 contains a volume of Rb-85 atoms and absorption cell 39 contains a volume of Rb-87 atoms. Heater transistor 40 applies heat to waveguide 35, which serves as an oven to heat the alkali-metal contents of filter cell 37 and absorption cell 39 to a precisely-defined and controlled temperature, such as 75° C., necessary to generate and maintain adequate Rb vapor in filter cell 37 and absorption cell 39. The vapor density of the Rb vapor in filter 37 and absorption cell 39 can be altered by the addition of one or more elements of a group consisting of alkali-metals, such as potassium. C-field coil 44 is conveniently wound around the outside of the waveguide 35 to provide the necessary dc magnetic field environment for the atoms contained in absorption cell 39.

Filter cell 37 and absorption cell 39 have a "tip-off" or fill tube, 45 and 46, respectively, which extends into the cavity inside the cell and serves as a conduit to carry Rb atoms and a buffer gas, if used, into the cavity during manufacture. Each of the fill tubes 45, 46 is preferably a glass tube having an outside diameter of 0.080 inches (2 mm). Fill tubes 45, 46 are attached to the respective cell in conjunction with a glass sealing and supporting ring 47 and 48, respectively. Glass sealing and supporting rings 47, 48 preferably have, for example, an outside diameter of 0.170 inches (4.3 mm) and a thickness of 0.090 inches (2.3 mm). In embodiments in which filter cell 37 includes a buffer gas, the buffer gas is preferably argon, or a similar gas, provided at a pressure of 100 torr or more. In embodiments in which absorption cell 39 includes a buffer gas, the buffer gas is preferably nitrogen, or a similar gas, or a noble gas, provided at a low pressure, such as 40 torr, although pressures of up to 100 torr are feasible. The buffer gas in absorption cell 39 allows a relatively small hyperfine transition line width (around 1–2 kHz), which is desirable in a high performance frequency standard.

Fill tube 45 of filter cell 37 is positioned on a sidewall of the cell to avoid interference with the light (L) entering light opening 43. Fill tube 45 is preferably positioned 0.180 inches (4.6 mm) from the outer glass window of filter cell 37 nearest to the light source. A hole or slot is provided in the sidewall of waveguide 35 to accommodate fill tube 45 and glass sealing and supporting ring 47.

Fill tube 46 of absorption cell 39 extends outwardly from a window of the cell. Absorption cell 39 is positioned within waveguide 35 with fill tube 46 extending toward photo cell 42. This preferred arrangement avoids the necessity of providing a hole in the cylindrical sidewall of waveguide 35 to accommodate fill tube 46, thereby avoiding possible interference with the TE-11 evanescent field in the absorption cell and the C-field coil.

The FIG. 2 apparatus operates in a manner similar to the apparatus of FIGS. 1A and 1B. Light energy (L) supplied by light source 31, such as a rubidium lamp or a laser, passes into physics package 30 through light opening 43. Dielectric resonator disk 38 is made of a low loss dielectric material that is transparent to the light frequency or frequencies useful in optically effecting energy level transitions of atoms in absorption cell 39. The useful light passes through filter cell 37, dielectric resonator disk 38, and absorption cell 39, and then impinges upon photo cell 42. The light traversing absorption cell 39 optically pumps and excites the atoms within absorption cell 39. Light absorbed in absorption cell 39 causes a reduction in the light reaching photo cell 42. Photo cell 42 responds to the received light by generating electrical current related, for example linearly, to the light intensity received and supplies an output current to servo electronics package 32a, which in turn supplies a signal to VCXO 32b to adjust the output frequency of VCXO 32b. Preferably, when locked, the output frequency of VCXO 32b is exactly 5 MHz or 10 MHz, although other frequencies of 20 MHz or higher can also be used to produce 5 MHz or 10 MHz outputs by division and/or synthesis. The output frequency of VCXO 32b is multiplied and synthesized by frequency multiplier-synthesizer 33 to produce a microwave exciting signal 33a which is supplied to E-field probe 41. Frequency multiplier-synthesizer 33 also generates a low frequency modulation signal which is supplied to internal circuitry to phase modulate the microwave excitation signal 33a, and also is supplied externally as modulation signal 33b to servo electronics package 32a to demodulate the ac signal derived from photo cell 42. E-field probe 41 is positioned near dielectric resonator disk 38 to supply electromagnetic energy into dielectric resonator disk 38, however, the exact location of E-field probe 41 positioned near dielectric resonator disk 38 is not critical and the scope of the invention is not intended to be limited to the preferred location shown in FIG. 2. Resonator disk 38, excited by the received electromagnetic energy, resonates to generate an evanescent electromagnetic field oscillating at approximately the resonant frequency of resonator disk 38 (i.e., the atomic transition frequency). The evanescent electromagnetic field penetrates absorption cell 39 to cause low level energy transitions of Rb-87 atoms between level B and level A, in the same manner as previously described.

The amplitude of the evanescent electromagnetic field is greatest at resonator disk 38 when the disk is resonant and decays approximately exponentially with distance along the Z axis as the distance from resonator disk 38 increases, thus providing an interrogator whose operation is essentially independent of the length of the waveguide 35. Absorption cell 39 must, however, be spaced as close as possible to resonator disk 38 (i.e. near or touching) so that there is a significant evanescent field amplitude at the end of absorption cell 39 closest to the resonator disk 38. It is the evanescent electromagnetic field generated by resonator disk 38 which penetrates absorption cell 39 and interrogates the alkali metal atoms, preferably Rb-87, contained in absorption cell 39 which causes the atoms to begin hyperfine energy level transitions from level B to level A.

A further feature of the embodiment of FIG. 2 is that the filter cell 37 does not have to be located closely to resonator disk 38, and variation in its spacing to resonator disk 38 can be used to fine tune the resonant frequency of the resonator disk 38.

Figure 3:
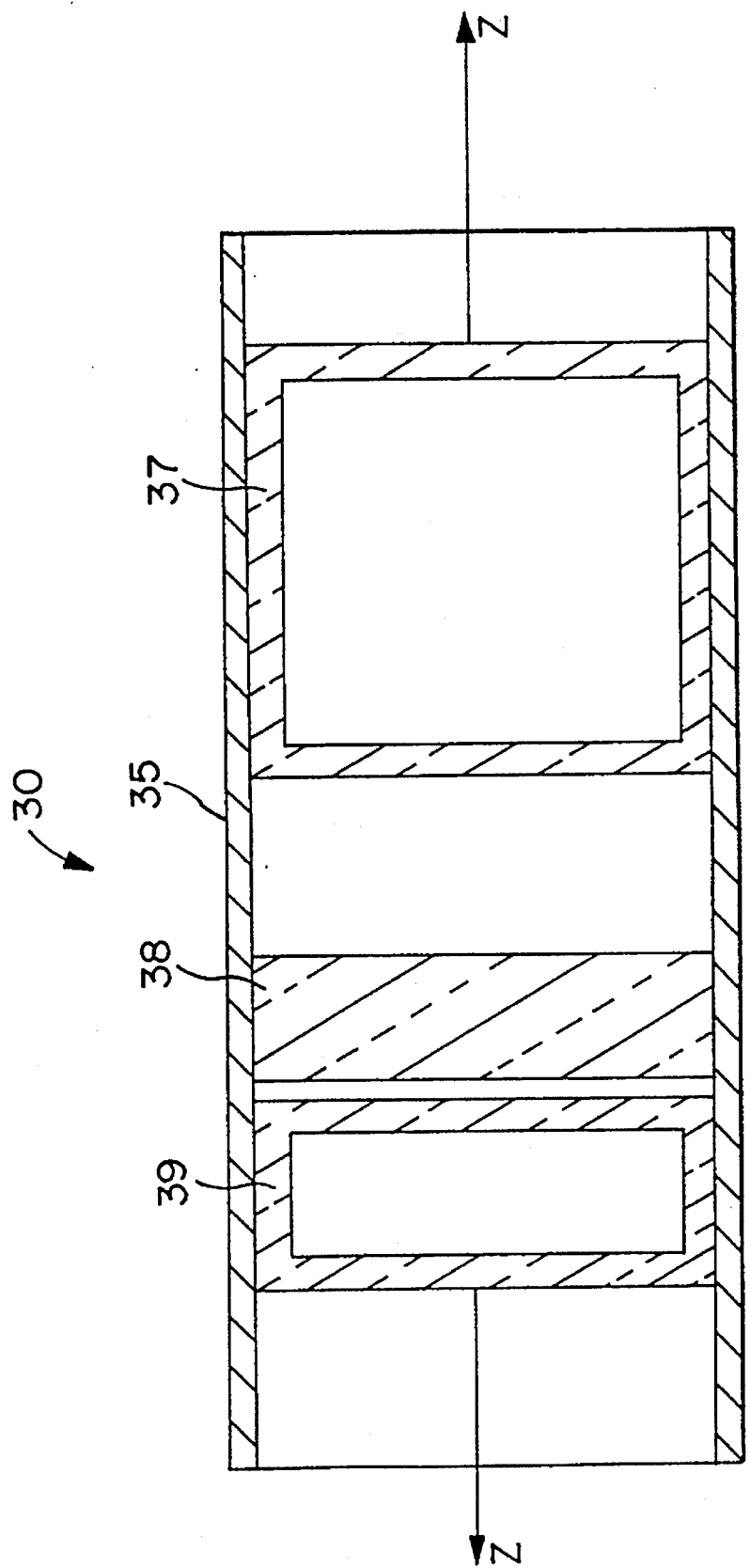
FIG. 3 shows a simplified diagrammatic representation of a waveguide portion of the embodiment of FIG. 2.

FIG. 3 shows diagrammatically a portion of the sectioned physics package 30 shown in FIG. 2, enlarged and exaggerated for purposes of illustration. Dielectric resonator disk 38 is positioned between filter cell 37 and absorption cell 39. The resonant frequency of resonator disk 38 is affected by the nearby presence of the glass structure of filter cell 37 and absorption cell 39. Absorption cell 39 should be positioned as close as possible to resonator disk 38 so that the evanescent field amplitude, which is substantially exponentially decaying, still has a sufficient magnitude inside absorption cell 39 to induce energy level transitions of the Rb-87 atoms. In contrast, the evanescent field has little effect on the Rb-85 atoms in filter cell 37. Since the Rb-85 atoms are not needed for hyperfine energy level transitions, filter cell 37 does not have to be in close proximity to resonator disk 38. Thus, filter cell 37 can be moved along the optical axis, Z, to vary the distance between resonator disk 38 and the adjacent window of filter cell 37. As a result, the position of filter cell 37 relative to resonator disk 38 can be varied to adjust the resonant frequency of resonator disk 38.

In the embodiments shown in FIGS. 1A–3, the dimensions of the resonator disk are chosen so that resonator disk is initially resonant at approximately 6.800 GHz, which corresponds generally to the rubidium atom transition frequency. Preferably, the resonator disk is a circular disk made of glass having a dielectric constant between about 6 and about 15, such as Corning 8161 glass, having a diameter of about 0.52 inches (1.32 cm) and a thickness of about 0.127 inches (3.23 mm), and which is transparent to the frequencies of light used to optically pump the alkali-metal atoms. Preferably, the absorption cell and, in the embodiments shown in FIGS. 2 and 3, also the filter cell, is/are constructed from Corning 1720 or 1724 glass having cell window thicknesses of about 0.040 inches (1 mm). By using Corning 8161 glass, the quality factor, Q, of the resonator disk is typically at least 100, and can be as high as about 120. In the embodiments shown in FIGS. 1A, 2 and 3, the system Q, which includes the loading effect of the photo cell located at one end of the waveguide and the two glass cells, is slightly less than the Q of the dielectric resonator. In the embodiment of FIG. 1B, the system Q is substantially less than the Q of the dielectric resonator due to the relatively close spacing of the resonator disk and the photo detector, and the system Q can be as small as 50 or even less. The Q is important because it determines the amount of microwave power required to produce the desired evanescent electromagnetic field. In other words, the higher the Q, the less microwave power is required to generate the evanescent electromagnetic field.

In the embodiments of FIGS. 2 and 3, resonator disk 38 is positioned between filter cell 37 and absorption cell 39. The amplitude of the evanescent field present at the open end of the waveguide 35 near light opening 43 has decayed to a small fraction of its original value at the location of resonator disk 38. Therefore, there is little radiation loss at the open end of waveguide 35, as evidenced in the system Q of approximately 100.

The resonant frequency of dielectric resonator disk 38 is dependent upon the following: the type of glass selected for, and the diameter of, filter cell 37, dielectric resonator disk 38, and absorption cell 39; the thickness and dielectric constant of the glass windows of filter cell 37 and absorption cell 39 lying perpendicular to optical axis, Z; the dielectric constant and the thickness of resonator disk 38; the distance between filter cell 37 and resonator disk 38; and the distance between resonator disk 38 and absorption cell 39. In a resonator package wherein filter cell 37 and absorption cell 39 comprise Corning 1720 glass having window thickness of 0.040 inches (1 mm) and a diameter of about 0.52 inches (1.32 cm); wherein resonator disk 38 comprises Corning 8161 glass having a dielectric constant of 8.1, a thickness of 0.127 inches (3.23 mm) and a diameter of about 0.520± 0.005 (13.21 mm ±0.13 mm); having an initial distance between filter cell 37 and resonator disk 38 of 0.020 inches (0.5 mm), and having a fixed distance between resonator disk 38 and absorption cell 39 of 0.020 inches (0.5 mm), the resonant frequency of resonator disk 38 is initially approximately 6.800 GHz. Increasing the distance between filter cell 37 and resonator disk 38 by 0.020 inches (0.5 mm) to a distance of 0.040 inches (1.0 mm) increases the resonant frequency by about 66 MHz. Increasing the distance between filter cell 37 and resonator disk 38 by an additional 0.020 inches (0.5 mm) to a distance of 0.060 inches (1.5 mm) increases the resonant frequency by an additional 31 MHz, for a total frequency increase of 97 MHz. The tuning range can be increased by selecting a thicker window for filter cell 37.

The precise dimensions listed above will depend upon the exact dielectric constant of resonator disk 38. The resonant frequency of the resonator disk made from a specific material, such as Corning 8161 glass, may vary between different batches of the same glass, and adjustments to the resonator disk dimensions can, of course, be made accordingly.

Physics package 30 of FIGS. 2 and 3 can be fine tuned to compensate for small unit-to-unit differences, such as resonator disk dimensions and dielectric constant, by adjusting the distance between filter cell 37 and resonator disk 38, preferably by moving filter cell 37 while maintaining the fixed position of resonator disk 38. Adjusting the distance between filter cell 37 and resonator disk 38 affects the resonant frequency of resonator disk 38, thereby providing tuning for the entire physics package 30. This tuning method is simple and effective. Still further, this tuning method does not substantially reduce the amplitude of the evanescent electromagnetic field in absorption cell 39, as would be the case if absorption cell 39 was moved rather than filter cell 37.

Figure 4:
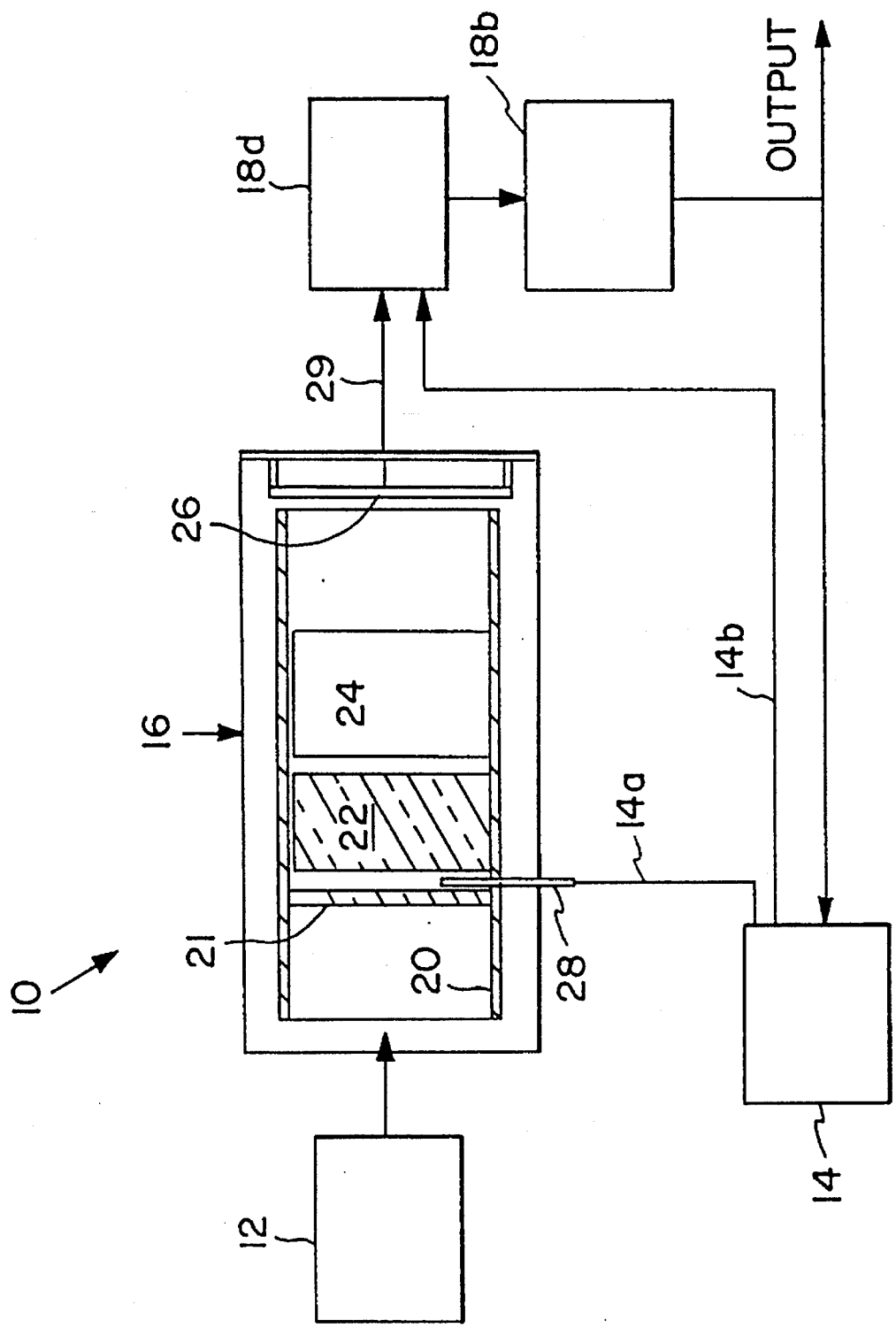
FIG. 4 shows the simplified sectional diagrammatic representation of the atomic frequency standard of FIG. 1A modified to include a tuning disk adjacent to the dielectric resonator.

As shown in FIG. 4, the embodiment of FIG. 1A, which does not include a filter cell, can be modified to provide adjustable tuning of the resonant frequency of dielectric resonator 22 of optical physics package 10 by movably mounting a tuning disk 21 adjacent to dielectric resonator 22 in waveguide 20. Tuning disk 21 is preferably a dielectric disk possessing characteristics equivalent to one of the dielectric windows of the filter cell described above in the discussion of the embodiment of FIGS. 2 and 3. Tuning of the resonant frequency of physics package 10 is achieved by moving tuning disk 21 with respect to the dielectric resonator 22 while maintaining the fixed position of dielectric resonator 22. The tuning disk tuning method is also applicable to the embodiment of FIG. 1B.

Figure 5:
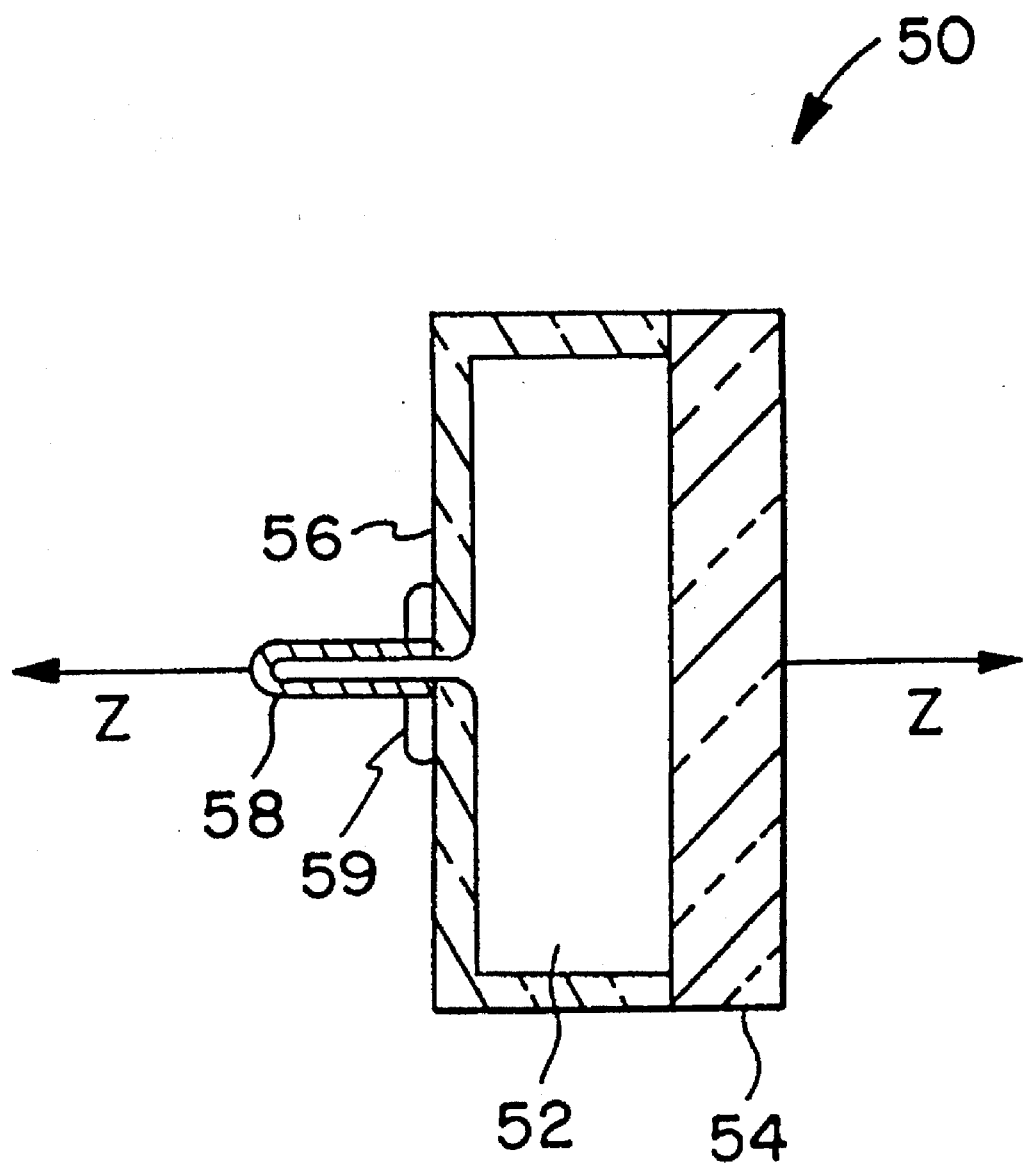
FIG. 5 shows a combined resonator disk/absorption cell which can be used in the embodiments of FIGS. 1A–4.

FIG. 5 shows an embodiment of a combined resonator disk/absorption cell 50. As previously stated, it is advantageous for the resonator disk and the absorption cell to be in close proximity. The absorption cell and resonator disk can be incorporated into a single structure by providing the resonator disk as an integral end part of the absorption cell or by attaching the resonator disk to the absorption cell as described below. Combined resonator disk/absorption cell 50 is an integral structure which includes an absorption cell 52 formed by attaching a resonator disk 54 to a glass structure 56 and having Rb-87 material positioned in the cavity formed therebetween. Combined resonator disk/absorption cell 50 includes a fill tube 58 which extends through a hole in glass structure 56 to the cavity inside the combined cell, and serves as a conduit to carry Rb atoms and a buffer gas, if used, into the cavity during manufacture. Fill tube 58 is attached to glass structure 56 in conjunction with a sealing and supporting ring 59 positioned around fill tube 58. Fill tube 58 and supporting ring 59 preferably are formed from glass compatible with or the same as that used to form glass structure 56.

Combined resonator disk/absorption cell 50 provides two potential advantages over discrete resonator disk and absorption cell units. First, since the atoms in absorption cell 52 are affected by the evanescent field of resonator disk 54 without the presence of any intervening material, in most cases the amplitude of the field in the absorption cell will be increased. This will have the effect of reducing the microwave power needed to achieve acceptable performance, which is desirable because of the expense in generating high levels of microwave power. Second, the parts cost is reduced because a previously needed window is eliminated.

Figure 6:
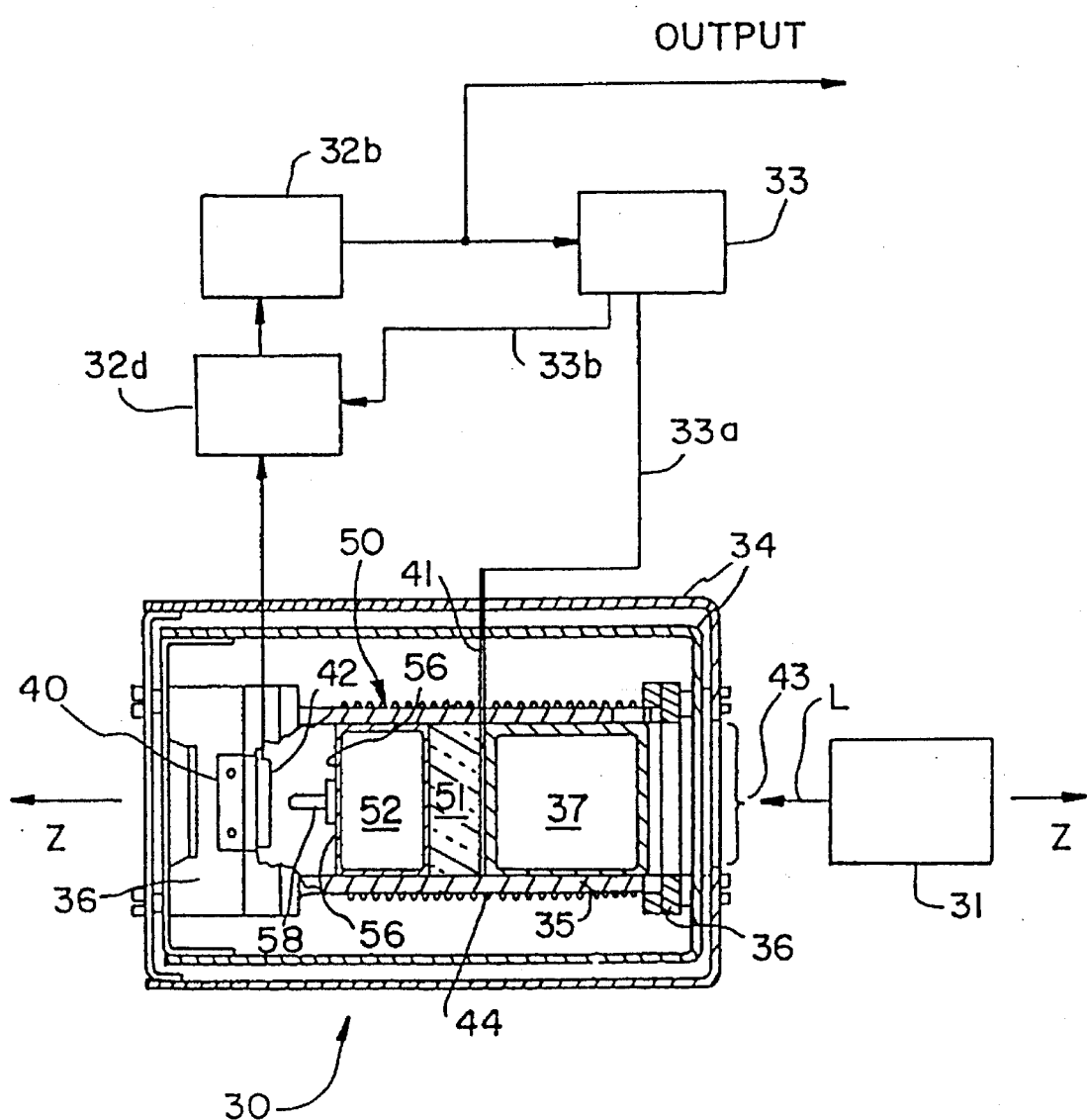
FIG. 6 shows a combined resonator disk/absorption cell incorporated into the atomic frequency standard structure of FIG. 2.

The resonator packages in FIGS. 1A–4 easily can be modified to incorporate the combined resonator disk/absorption cell 50 by replacing the individual resonator disk and absorption cell with the combined unit 50. For example, as shown in FIG. 6 the physics package 30 of FIG. 2 is adapted to incorporate the combined resonator disk/absorption cell 50 of FIG. 5. Combined resonator disk/absorption cell 50 is positioned in waveguide 35 so that the resonator disk 54 portion of combined resonator disk/absorption cell 50 is adjacent to filter cell 37. The fine tuning method for the resonator disk described above, in which the spacing between the filter cell and resonator disk is varied, also applies to a resonator package containing combined resonator disk/absorption cell 50. Preferably, fill tube 58 of combined resonator disk/absorption cell 50 is positioned to extend toward an end of waveguide 35 and toward photo cell 42. Also, combined resonator disk/absorption cell 50 can contain atoms, such as Rb-85, to provide optical filtering.

Atomic frequency standards embodying the invention as shown in FIGS. 1A–4 and 6 include an electrically open-ended waveguide and a dielectric resonator, as opposed to having a microwave cavity requiring endwalls to obtain resonance at the frequencies required to effect atom transitions between hyperfine energy levels A and B. An atomic frequency standard using an electrically open-ended waveguide has a significant advantage over an atomic frequency standard using a conventional microwave cavity. As the dimensions of the microwave cavity are reduced, the size of the light hole in an endwall of the microwave cavity must remain about the same to avoid limiting the light energy available for operation, and the light hole must consume a larger fraction of the endwall than desirable. Thus, it becomes more difficult to maintain an efficient operation of small microwave cavities because the endwall essentially vanishes as the diameter of the microwave cavity approaches the diameter of the light hole and microwave energy escapes from the cavity. If the diameter of the light hole in the endwall of the conventional microwave cavity is reduced proportionally with the reduction of the dimensions of the microwave cavity so as to maintain the beneficial effect of the endwall, then the light from the Rb lamp becomes obstructed by the diminished size of the light hole, resulting in the reduction of the intensity of the light entering the absorption cell to effect optical pumping. The embodiments of the invention shown in FIGS. 1A–4 and 6, in contrast, do not need a microwave cavity or endwalls to maintain resonance, and therefore, the diameter of the waveguide can be reduced theoretically down to a minimum size capable of passing sufficient light from an Rb lamp to effect optical atomic energy level transitions. Also, the invention can provide a minimal size physics package for use with a laser light source.

In the embodiments shown in FIGS. 1A–4 and 6, the waveguide dimensions are chosen so that the resonant package operates below cutoff at 6.834 GHz in the TE-11 mode. A waveguide having an inside diameter (i.d.), for example, of 1.0 inches has a cutoff frequency of 6.92 GHz for a TE-11 mode, which is above the rubidium frequency of approximately 6.834 GHz. This allows use of a preferred smaller waveguide i.d., such as 0.525±0.005 inches, which accommodates the diameter of the filter cell, dielectric resonator disk and absorption cell. The waveguide diameter should be about 0.002 to 0.005 inches larger than the diameter of the filter cell so that the filter cell may be moved within the waveguide. Also, the field distribution in the direction perpendicular to the waveguide axis, i.e. the optical axis Z, is the same as that in a TE-111 mode cavity used in other rubidium standards that use a conventional microwave cavity. Since the waveguide does not function as a resonator cavity, the resonant frequency of the optical physics package is essentially independent of the length of the waveguide, thus, a relatively short length, such as 1.5 inches, can be realized. Also, since the evanescent field produced by the dielectric resonator disk decays approximately exponentially as a function of distance from the disk, the ends of the waveguide have no effect on the evanescent field, provided that the resonator disk is positioned a sufficient distance from one end of the waveguide, such as about 2.5 or more decay lengths. In a preferred embodiment wherein the waveguide has an inside diameter of about 0.525 inches which defines and contains a 6.834 GHz evanescent field, the decay length is about 0.17 inches (4.3 mm). Thus, the distance between the end of the 0.525 i.d. waveguide and the resonator disk generating an evanescent field oscillating at 6.834 GHz should be a distance greater than about 2.5 decay lengths, i.e. a distance greater than about 0.42 inches (10.8 mm).

Figure 7A:
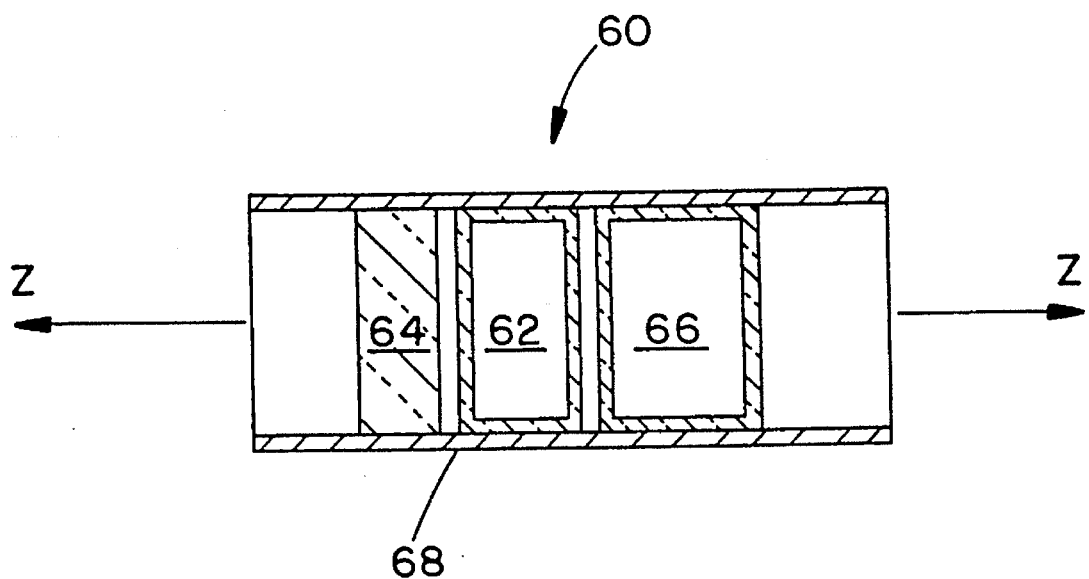
FIG. 7A shows a simplified sectional diagrammatic representation of an optical physics package having an absorption cell positioned between a resonator disk and a filter cell.

Although preferred embodiments of the invention position the resonator disk between the filter cell and the absorption cell, the invention is not limited to this arrangement. FIG. 7A shows a simplified representation of an optical physics package 60 having an absorption cell 62 positioned between a resonator disk 64 and a filter cell 66, all of which are positioned within a waveguide 68. The characteristics and dimension of absorption cell 62, resonator disk 64, and filter cell 66 are preferably identical to those described in the previous embodiments. In the arrangement of FIG. 7A, however, filter cell 66 is positioned in waveguide 68 too remote in relation to resonator disk 64 to provide effective tuning of resonator disk 64.

Figure 7B:
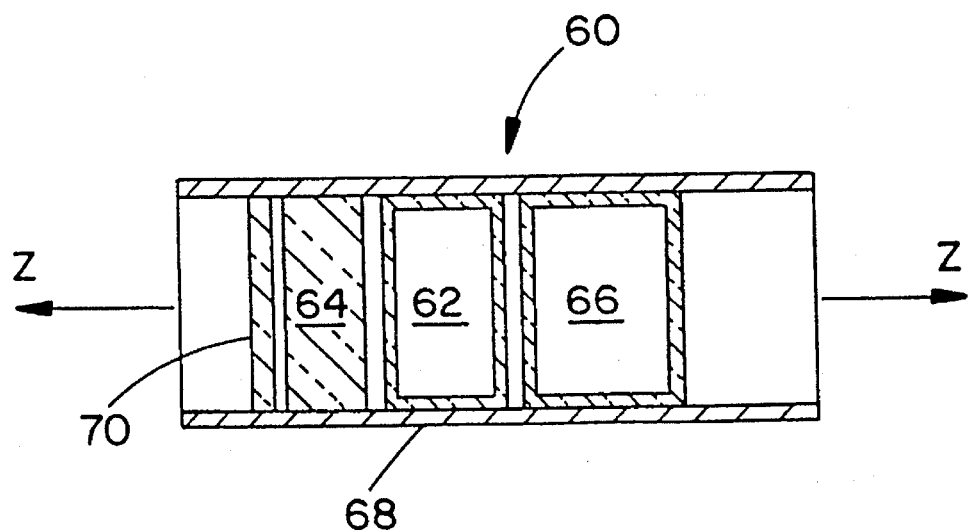
FIG. 7B shows the simplified sectional diagrammatic representation of the optical physics package shown in FIG. 7A modified to include a tuning disk adjacent to the resonator disk.

As shown in FIG. 7B, however, tuning of the embodiment shown in FIG. 7A is achieved by providing a tuning disk 70 movably mounted in waveguide 68 adjacent to a fixedly mounted resonator disk 64. Tuning disk 70 is preferably a dielectric disk having characteristics equivalent to one of the windows of the filter cell described above in embodiments using the filter cell to effect tuning of the resonant frequency. Fine tuning of the resonant frequency of resonator disk 64 of physics optical package 60 is achieved by adjusting the distance between the movable tuning disk 70 and the resonator disk 64.

Figure 8:
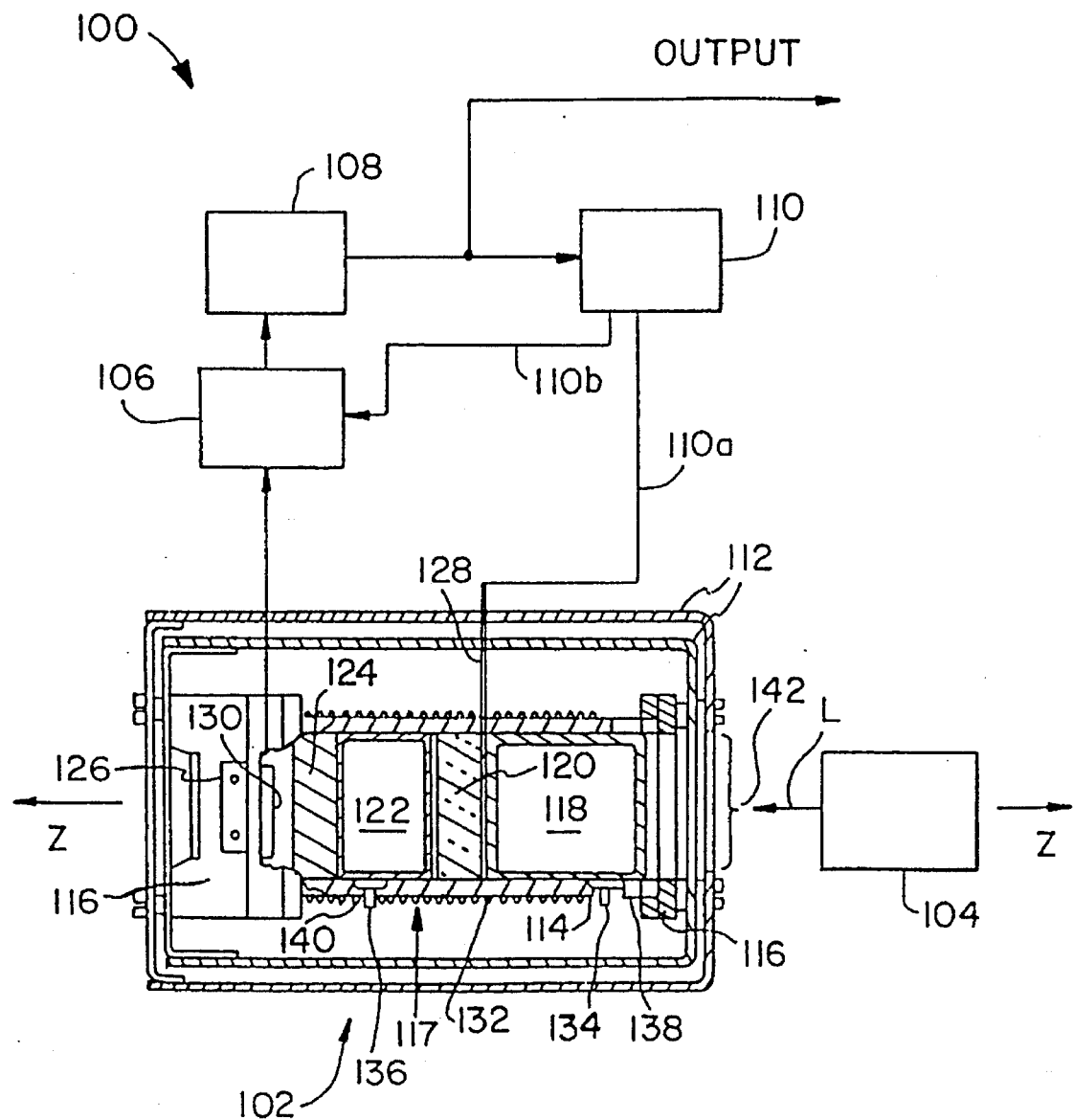
FIG. 8 shows a sectional diagrammatic drawing of an embodiment of the invention with a portion of the waveguide and waveguide supports broken away to expose the multiple dielectric resonators.

The atomic frequency standard 100 shown in FIG. 8 differs from previous embodiments in that multiple dielectric resonators are used to generate the evanescent electromagnetic field, as opposed to using a single dielectric resonator to generate the evanescent electromagnetic field. Atomic frequency standard 100 includes an optical physics package 102, a light source 104, a servo electronics package 106, a VCXO 108, and a multiplier-synthesizer 110. Physics package 102 includes a pair of magnetic shields 112 positioned around an electrically open-ended waveguide 114; waveguide supports 116; an optics arrangement 117 which includes a filter cell 118, a first dielectric resonator disk 120, an absorption cell 122, and a second dielectric resonator disk 124; a heater transistor 126; an E-field probe 128; a photo cell 130 and a C-field coil 132.

Magnetic shields 112 are formed from material having a high magnetic permeability to provide effective shielding from the earth's magnetic fields and from any other source of magnetic fields. Mounted to magnetic shields 112 are waveguide supports 116. Waveguide supports 116 are preferably formed from a thermally insulating material, such as polyamide fiberglass. Waveguide supports 116 mount waveguide 114 within optical physics package 102.

Waveguide 114 is preferably an electrically open-ended cylindrical tube having an electrically conductive, preferably metallic, inner surface, or a solid copper tube, and having a circular cross section dimensioned to provide operation below cutoff at the atomic transition frequency in use. Waveguide 114 is preferably covered at its open end(s) by a covering that is substantially transparent, such as MYLAR®, sapphire or glass, to reduce temperature gradients in filter cell 118 and absorption cell 122. Covering an open end of the waveguide 114 with a substantially transparent cover will not substantially affect the performance of optical physics package 102 provided that the evanescent field has sufficiently decayed prior to reaching the electrically open end so that no substantial electromagnetic energy escapes from the waveguide. Fixedly positioned inside waveguide 114 are filter cell 118, first dielectric resonator disk 120, absorption cell 122 and second dielectric resonator disk 124.

Each of the dielectric resonator disks 120, 124 may be a small circular disk of low loss glass material such as Corning 8161 glass, which has a quality factor typically in excess of 100 at the atomic hyperfine energy level transition frequency. Filter cell 118 and absorption cell 122 each contain a volume of alkali-metal atoms. In a rubidium standard, filter cell 118 contains a volume of Rb-85 atoms and absorption cell 122 contains a volume of Rb-87 atoms. Heater transistor 126 applies heat to waveguide 114, which serves as an oven to heat the alkali-metal contents of filter cell 118 and absorption cell 122 to a precisely-defined and controlled temperature, such as 75° C., necessary to generate and maintain Rb vapor in filter cell 118 and absorption cell 122. C-field coil 132 is positioned around the outside of the waveguide 114 to provide the necessary dc magnetic field environment for the atoms contained in absorption cell 122.

Filter cell 118 and absorption cell 122 have a "tip-off" or fill tube, 134 and 136, respectively, which extends into the cavity inside the cell and serves as a conduit to carry Rb atoms and a buffer gas, if used, into the cavity during manufacture. Fill tubes 134, 136 are attached to the respective cell in conjunction with a sealing and supporting ring 138 and 140, respectively. In embodiments in which filter cell 118 includes a buffer gas, the buffer gas is preferably argon, or a similar gas, provided at a pressure of about 100 torr or more. In embodiments in which absorption cell 122 includes a buffer gas, the buffer gas is preferably nitrogen, or a similar gas, or a noble gas, provided at a low pressure, such as about 40 torr, although pressures of up to 100 torr are feasible. The buffer gas in absorption cell 122 allows a relatively small hyperfine transition absorption line width (around 1–2 kHz), which is desirable in a high performance frequency standard.

Fill tube 134 of filter cell 118 is positioned on a sidewall of the cell to avoid interference with the light (L) entering light opening 142. Fill tube 134 is preferably positioned near the outer glass window of filter cell 118 closest to light source 104. A hole or slot is provided in the sidewall of waveguide 114 to accommodate fill tube 134 and sealing and supporting ring 138.

Fill tube 136 of absorption cell 122 also is positioned on a sidewall of the cell to allow each of the resonator disks 120, 124 to be positioned in close proximity to one of the windows of absorption cell 122. A hole or slot is provided in the sidewall of waveguide 114 to accommodate fill tube 136 and sealing and supporting ring 140. Absorption cell 122 is positioned between first resonator disk 120 and second resonator disk 124 so that the atoms in absorption cell 122 will be influenced by the evanescent electromagnetic field generated by the two resonator disks 120, 124.

Light energy (L) supplied by light source 104, such as a rubidium lamp, passes into physics package 102 through light opening 142. Dielectric resonator disks 120, 124 are made of a low loss dielectric material that is transparent to the light frequency or frequencies useful in optically effecting energy level transitions of atoms in absorption cell 122. The useful light passes through filter cell 118, first dielectric resonator disk 120, absorption cell 122, and second dielectric resonator disk 124, and then impinges upon photo cell 130. The light traversing absorption cell 122 optically pumps and excites the atoms within absorption cell 122. Light absorbed in absorption cell 122 causes a reduction in the light reaching photo cell 130. Photo cell 130 responds to the received light by generating electrical current related, for example linearly, to the light intensity received and supplies an output signal to servo electronics package 106, which in turn supplies a signal to VCXO 108 to adjust the output frequency of VCXO 108. Preferably, when locked, the output frequency of VCXO 108 is exactly 5 MHz or 10 MHz, although other frequencies of 20 MHz or higher can also be used to produce 5 MHz or 10 MHz outputs by division and/or synthesis. The output frequency of VCXO 108 is multiplied and synthesized by frequency multiplier-synthesizer 110 to produce a microwave exciting signal 110a which is supplied to E-field probe 128. Frequency multiplier-synthesizer 110 also generates a low frequency modulation signal which is supplied to internal circuity to phase modulate the microwave excitation signal 110a, and also is supplied externally as modulation signal 110b to demodulate the ac signal derived from photocell 130. E-field probe 128 is positioned near first dielectric resonator disk 120 and supplies electromagnetic energy to both dielectric resonator disks 120, 124, however, the exact location of E-field probe 41 positioned near either of the dielectric resonator disks is not critical and the scope of the invention is not intended to be limited to the preferred location shown in FIG. 8. Resonator disks 120, 124, excited by the received electromagnetic energy, resonate to generate an evanescent electromagnetic field oscillating at a frequency (i.e., the atomic transition frequency) not necessarily the same as that of either disk operating independently. The evanescent electromagnetic field penetrates absorption cell 122 to interrogate the Rb-atoms thereby causing low level energy transitions of Rb-87 atoms between level B and level A.

The amplitude of the evanescent electromagnetic field generated by the bidisk system of FIG. 8 is relatively uniform in the region between the two resonator disks 120, 124. In comparison, the amplitude of the evanescent electromagnetic field generated by a single, isolated, resonator disk in a waveguide decays exponentially with an increase in the axial distance from the disk. Even when the absorption cell is present, the amplitude decay of the evanescent electromagnetic field in a single disk system is approximately exponential. The spatial inhomogeneity of the evanescent field in the absorption cell in a single disk system can be greatly improved in the axial direction, Z, by the addition of the second resonator disk positioned on a side of the absorption cell opposite to the first resonator disk to form a bidisk system, as shown for example in FIG. 8, provided that the spacing between the resonator disks is not larger than 2–3 decay lengths of the single disk system, and provided that the bidisk system is resonant at the desired frequency.

Figure 9:
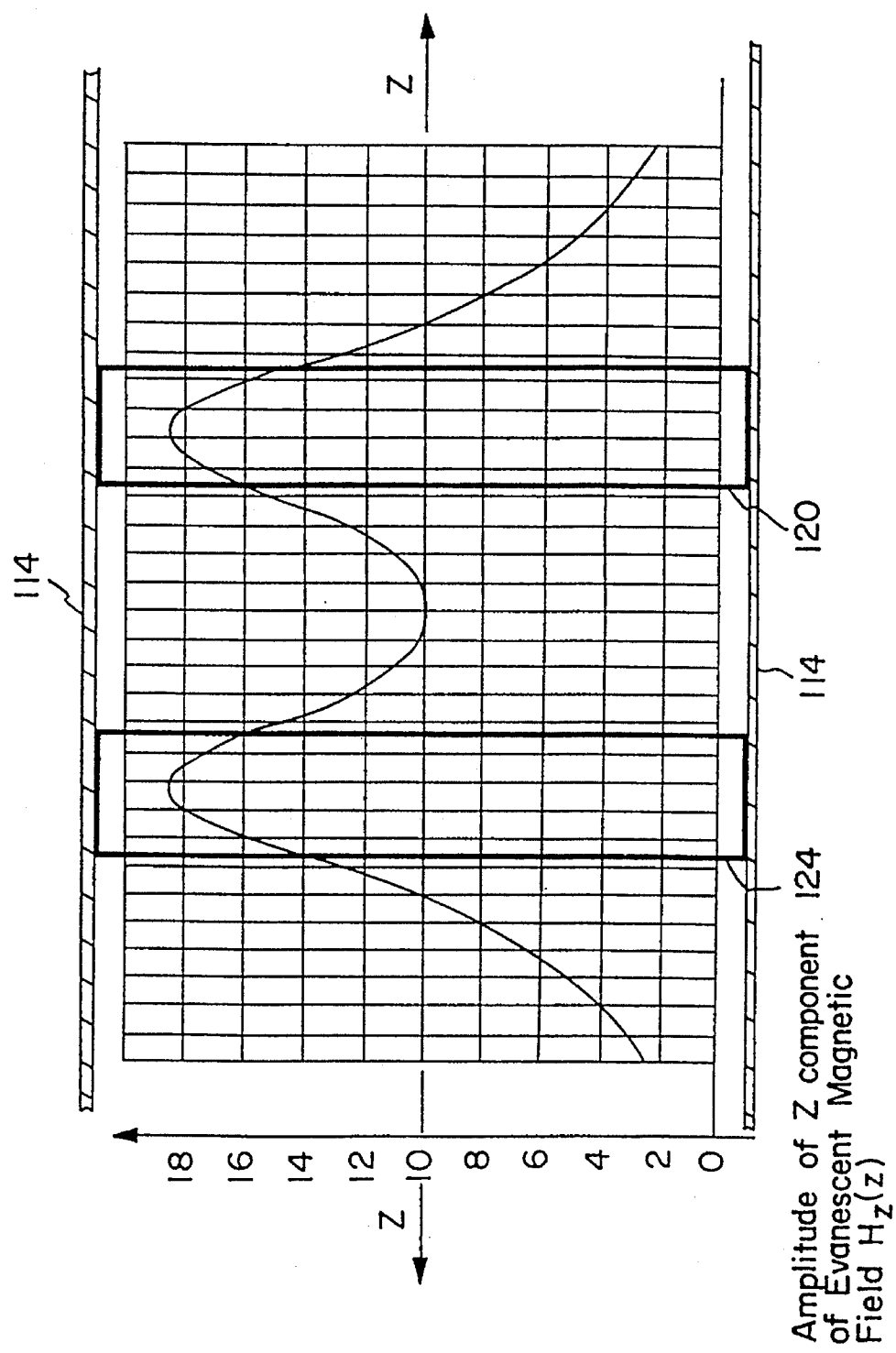
FIG. 9 shows a graphical depiction of the predicted evanescent magnetic field amplitude as a function of distance from a surface of each resonator disk in a bidisk system.

FIG. 9 shows a graphical depiction of the predicted evanescent magnetic field amplitude of a bidisk system, such as the bidisk system of FIG. 8, which plots the amplitude of the Z-component of the evanescent magnetic field, $H_z(z)$, in arbitrary units as a function of distance along the Z axis from the surfaces of resonator disks 120, 124. The absolute strength of $H_z(z)$ is determined by the degree of electromagnetic excitation of resonator disks 120, 124. The reason for selecting $H_z(z)$ for display in FIG. 9 is that $H_z(z)$ is usually the component of the microwave evanescent electromagnetic field that interrogates the atoms, and the other components of the evanescent electromagnetic field are either completely or largely ineffective in this regard.

The plot of the evanescent field amplitude shown in FIG. 9 can be generated based on the analytical solution of Maxwell's equations of electromagnetism as applied to a bidisk system assuming the following parameters: the inside diameter of waveguide 114 is 0.52 inches (13.2 mm); the resonator disks 120, 124 are symmetrical having an outside diameter of 0.52 inches (13.2 mm), a thickness of 0.17 inches (4.2 mm), and a dielectric constant of 8.1; the distance between resonator disks 120, 124 is 0.34 inches (8.6 mm, or 2 decay lengths of a single disk system) with no dielectric material positioned therebetween; and the bidisk system operates in a TE-11 mode at a resonant frequency of about 6.815 GHz.

The amplitude, $H_z(z)$, of the evanescent magnetic field between the facing surfaces of resonator disks 120, 124 decreases somewhat along the optical axis, Z, from its maximum of approximately 16 units to a minimum of about 10 units as the distance from either of the resonator disks 120, 124 increases. The minimum amplitude, $H_z(z)$, of the evanescent field occurs near the midpoint between resonator disk 120, 124, wherein the field amplitude is approximately 63% of the maximum amplitude of the evanescent magnetic field at the surface of either of the resonator disks 120, 124. In contrast, the evanescent magnetic field amplitude in the regions extending from the non-facing surfaces of resonator disks 120, 124 decays exponentially from a maximum of 14 units. Thus, the bidisk system generates between the facing surfaces of resonator disks 120, 124 a region of comparatively and relatively uniform evanescent field amplitude in which the evanescent field amplitude at the facing surfaces of resonator disks 120, 124 is greater than the evanescent field amplitude at the non-facing surfaces of resonator disks 120, 124, and wherein the evanescent field amplitude at any distance extending inwardly from the facing surfaces of resonator disks 120, 124 is greater than the evanescent field amplitude would be at an equivalent distance extending outwardly from the non-facing surfaces of resonator disks 120, 124, and is greater than the evanescent field amplitude would be at an equivalent distance from the resonator disk in a single disk system.

The production of such a relatively uniform evanescent field has two advantages. First, the interrogation of the atoms in an absorption cell positioned between the two resonator disks is more efficient because the field amplitude at the surface of either disk can be adjusted so that more of the atoms in the absorption cell see a field amplitude that is closer to the optimum value for inducing the hyperfine transition. Second, the reduction of the inhomogeneity of the interrogating field contributes to the reduction of the overall inhomogeneity inside the absorption cell which, as is well known by those skilled in the art, reduces the tendency for aging of the reference frequency provided by a buffer-gas absorption cell.

Decreasing the distance between resonator disks 120, 124 will generally tend to increase the amplitude of the evanescent field at the midpoint between resonator disks 120, 124, whereas increasing the distance between resonator disks 120, 124 will tend to decrease the evanescent field amplitude at the midpoint. If the distance between resonator disks 120, 124 is increased to a distance wherein there is no interaction between resonator disks 120, 124, the resonator disks 120, 124, if electromagnetically excited, would each operate as a single disk, and the previous advantage of producing the relatively uniform evanescent field amplitude would be substantially negated.

The above description of the operation and advantages of a bidisk system also apply qualitatively to modes other than the TE-11 mode. For example, for the TE-01 mode, the description is largely unchanged, the main difference being that all physical dimensions will be larger than for the TE-11 mode. The overall homogeneity of $H_z(z)$, however, is improved by using the TE-01 mode because, unlike the TE-11 mode, it exhibits no dependence on polar angle in any plane perpendicular to the waveguide/optical axis.

Figure 10:
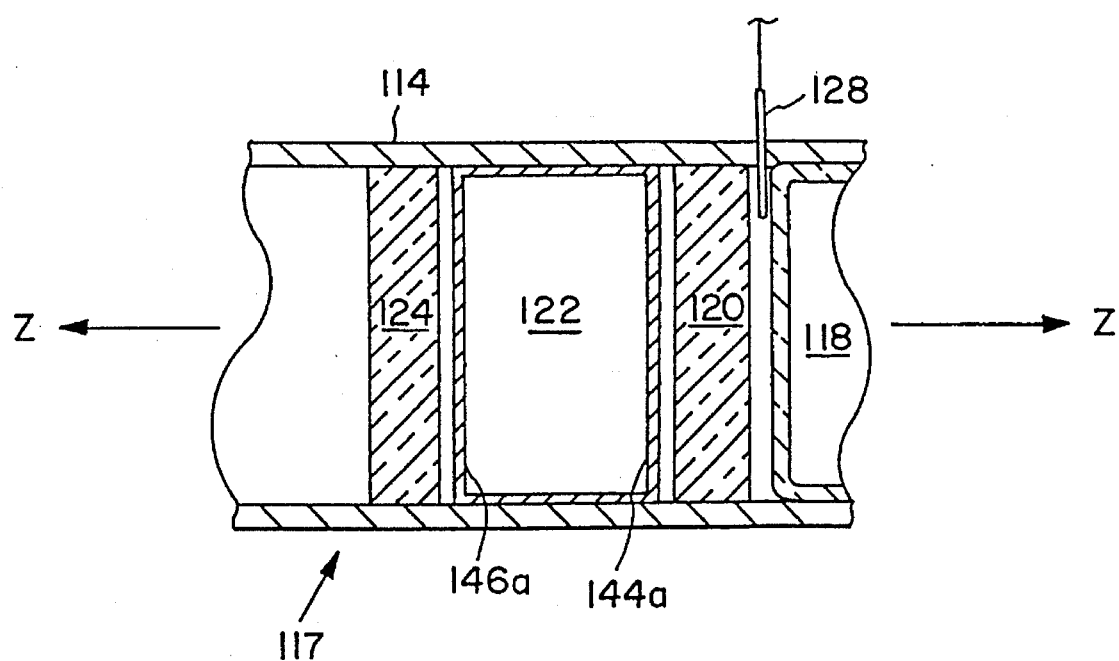
FIG. 10 shows a more detailed view of a portion of the waveguide section of FIG. 8 wherein an optics arrangement includes an absorption cell having relatively thin windows and a low dielectric constant.

FIG. 10 shows in greater detail a sectioned portion of waveguide 114 of FIG. 8 containing optics arrangement 117, which includes dielectric resonator disks 120, 124 and absorption cell 122. Resonator disks 120, 124 are positioned adjacent to windows 144a and 146a, respectively, of absorption cell 122. Windows 144a, 146a are relatively thin and possess a low dielectric constant so that windows 144a, 146a do not substantially perturb the evanescent field generated by dielectric resonator disks 120, 124. Thus, in this arrangement, absorption cell 122 does not produce a significant loading effect on the waveguide and, accordingly, does not significantly influence the resonant frequency of the bidisk waveguide system. Therefore, absorption cell 122 can be essentially disregarded when determining the dimensions of resonator disks 120, 124.

FIGS. 11–14 show various exemplary alternative configurations for optics arrangement 117 of FIG. 8.

Figure 11:
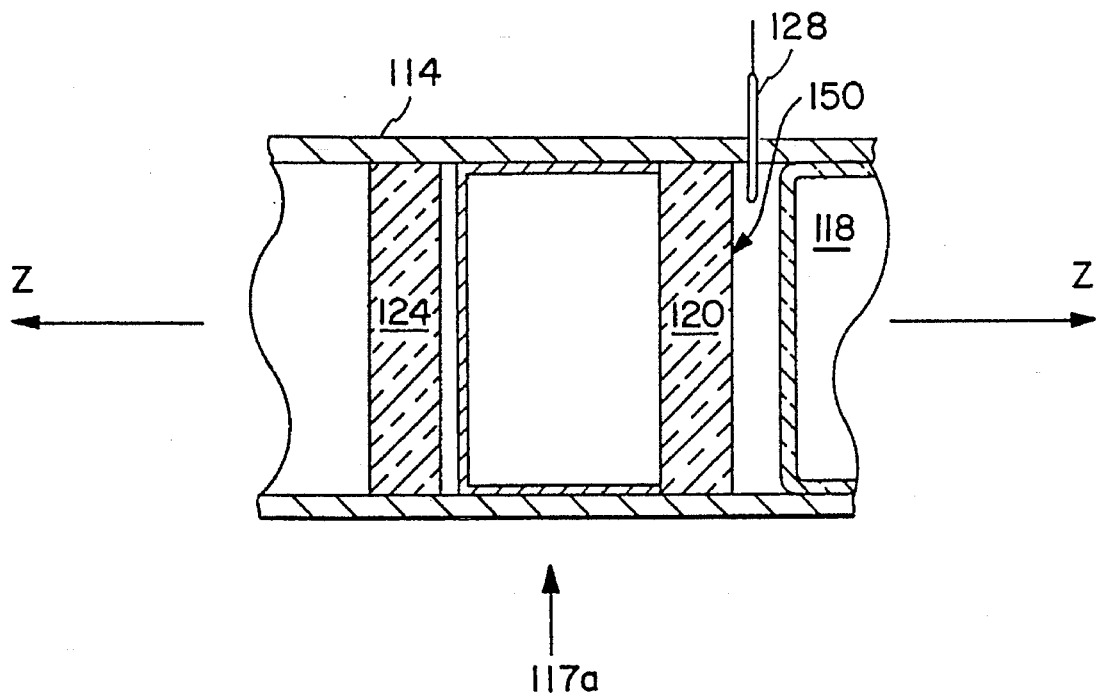
FIG. 11 shows an optics arrangement forming a substantially functional equivalent of FIG. 10 wherein a dielectric resonator forms a window of the absorption cell.

FIG. 11 shows an embodiment of an optics arrangement 117a which includes a combined resonator disk/absorption cell 150 which cooperates with dielectric resonator 124 to form substantially an operational equivalent of the embodiment of FIG. 10. As previously stated, it is advantageous for the dielectric resonator and the absorption cell to be in close proximity. Absorption cell 122 and dielectric resonator disk 120 shown in FIG. 10 can be incorporated into a single structure by providing the dielectric resonator as an integral end part of the absorption cell or by attaching the dielectric resonator to the absorption cell.

Figure 12:
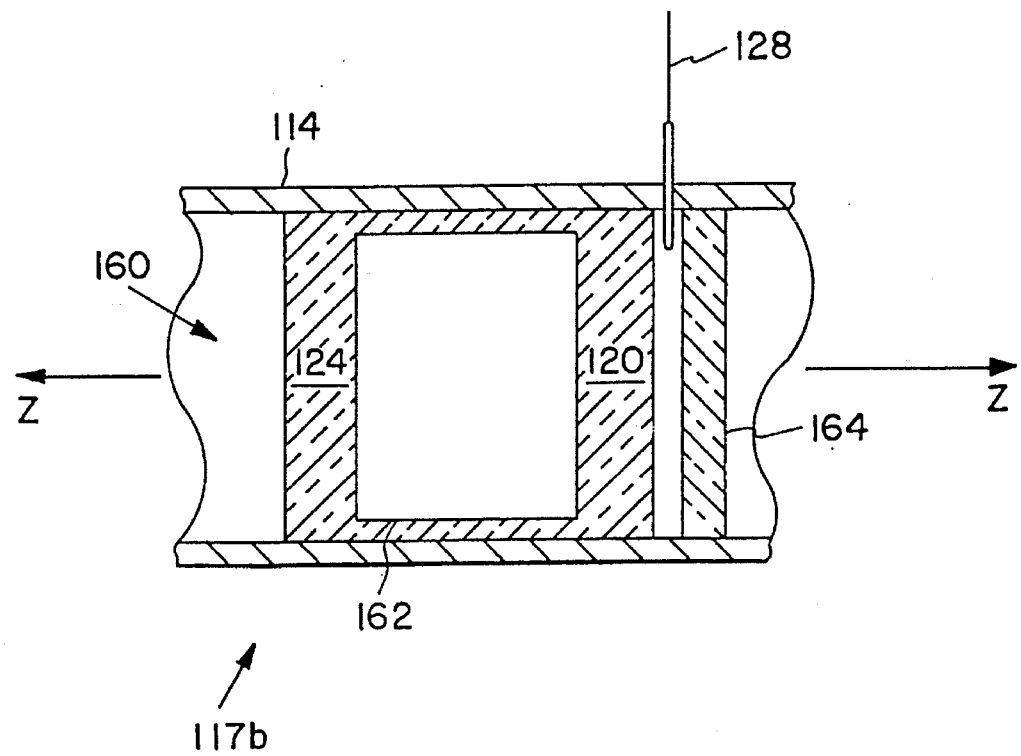
FIG. 12 shows an optics arrangement having a combined dielectric resonator/absorption cell unit wherein multiple dielectric resonators form the windows of the absorption cell.

FIG. 12 shows an optics arrangement 117b which includes a combined dielectric resonator/absorption cell 160 positioned in waveguide 114 and having dielectric resonators 120, 124 located at each of the opposing ends of the absorption cell structure 162 to contain the absorption cell atoms, such as Rb-87 atoms. Dielectric resonators 120, 124 can be provided either as an integral part of the absorption cell or by attaching the dielectric resonators 120, 124 to opposite ends of a structure, such as a glass tube. A tuning disk 164 is positioned near dielectric resonator 120 to affect the resonant frequency of the evanescent field generated by dielectric resonators 120, 124.

In most cases, the embodiments of FIGS. 11 and 12 produce an increase of the amplitude of the evanescent field in the absorption cell as compared to optical physics packages using a separate absorption cell and one or more discrete dielectric resonator(s) because the atoms in the absorption cell are affected by the evanescent field with a reduction in, or an elimination of, the presence of intervening material. This will have the effect of reducing the microwave power needed to achieve acceptable performance, which is desirable because of the expense in generating high levels of microwave power. Also, the parts cost is reduced because at least one of the previously needed absorption cell windows is eliminated.

Figure 13:
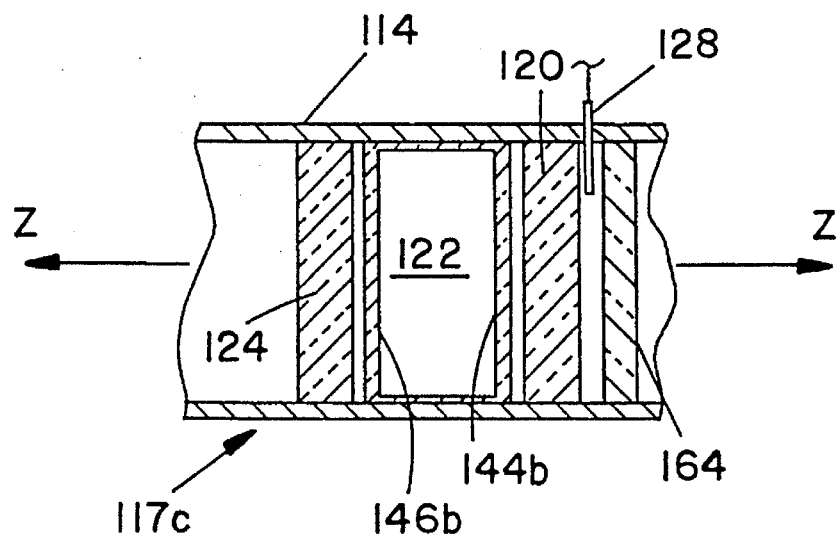
FIG. 13 shows a more detailed view of a portion of a waveguide section containing an optics arrangement wherein the absorption cell has relatively thick windows having a relatively high dielectric constant.

FIG. 13 shows the same portion of waveguide 114 shown in FIG. 10 having an optics arrangement 117c which includes dielectric resonator disks 120, 124 and absorption cell 122, and in addition, a tuning disk 164. The absorption cell of FIG. 13 differs from the absorption cell of FIG. 10, however, in that alternate windows 144b and 146b of absorption cell 122 have greater thickness and/or possess a relatively high dielectric constant so that windows 144b, 146b do perturb the resonant frequency of the double disk system. Thus, the system essentially operates as a four disk system wherein dielectric resonator disk 120 and window 144b operate as a first evanescent field generating unit, and dielectric resonator disk 124 and window 146b operate as a second evanescent field generating unit.

Physics package 102 containing the optics arrangements 117 or 117a of FIGS. 8, 10 and 11 can be fine tuned to compensate for small unit-to-unit differences, such as resonator disk dimensions and dielectric constant, by adjusting the distance between filter cell 118 and resonator disk 120, preferably by moving filter cell 118 while maintaining the fixed position of resonator disk 120. Adjusting the distance between filter cell 118 and resonator disk 120 affects the resonant frequency of resonator disks 120, 124, thereby providing tuning for the entire physics package 102. Physics package 102 can also be tuned by adjusting the distance between one or both dielectric disks 120, 124 and absorption cell 122, although it is less desirable to effect tuning in this manner because increasing the distance between either dielectric resonator disk 120 or 124 and absorption cell 122 would reduce the amplitude of the evanescent electromagnetic field in absorption cell 122.

In the embodiments shown in FIGS. 12 and 13, adjustable tuning of the resonant frequency of dielectric resonators 120, 124 can be provided by movably mounting tuning disk 164 near dielectric resonator 120 in waveguide 114. Tuning disk 164 is preferably a dielectric disk possessing characteristics equivalent to one of the dielectric windows of the filter cell described above in the discussion of the embodiment of FIGS. 2 and 3. Tuning of the resonant frequency of an optical physics package which includes tuning disk 164 preferably is achieved by moving tuning disk 164 along the Z axis with respect to the dielectric resonator 120 while maintaining the fixed position of dielectric resonators 120, 124. Although tuning disk 164 is shown in FIGS. 12 and 13 near dielectric resonator 120, tuning also can be achieved by positioning tuning disk 164 near dielectric resonator 124 and by varying along the Z axis the distance between tuning disk 164 and dielectric resonator 124. Also, tuning can be achieved by positioning one of a plurality of tuning disks near each of the dielectric resonators 120, 124 and by varying along the Z axis the distance between one or more of the tuning disks and the respective dielectric resonator(s).

Figure 14:
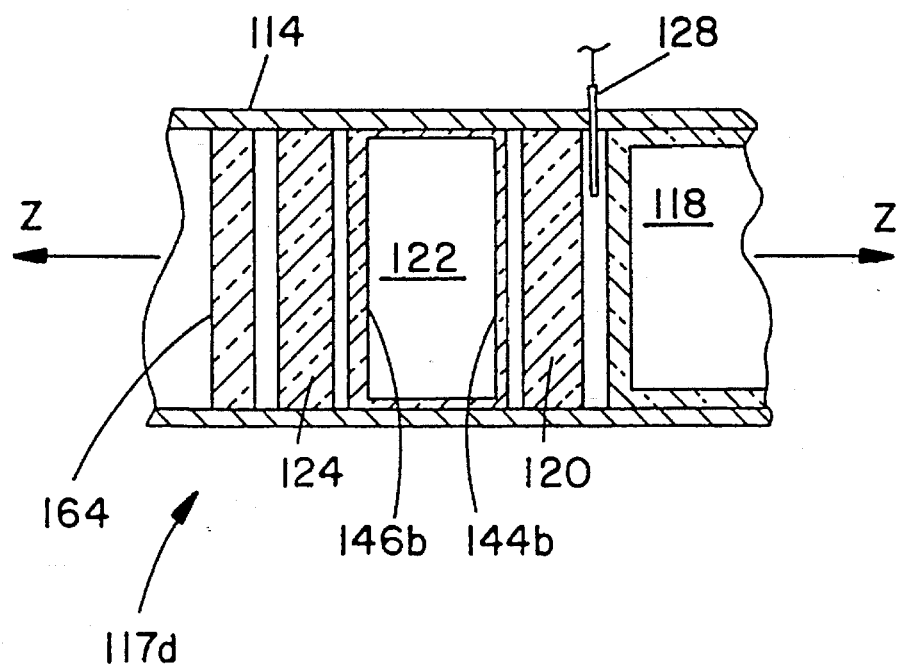
FIG. 14 shows an optics arrangement wherein a tuning disk and a filter cell are positioned near respective dielectric resonators.

FIG. 14 shows an optics arrangement 117d which includes an absorption cell 122 having dielectric resonators 120, 124 positioned near opposite windows 144b, 146b, respectively, of absorption cell 122. Filter cell 118 is positioned near a side of dielectric resonator 120 opposite to window 144b of absorption cell 122, and tuning disk 164 is positioned near a side of dielectric resonator 124 opposite to window 146b of absorption cell 122. The resonant frequency of an optical physics package containing the component arrangement of optical unit 117d can be tuned by varying the distance between filter cell 118 and dielectric resonator 120, and/or by varying the distance between tuning disk 164 and dielectric resonator 124. Preferably, absorption cell 122 and resonator disks 120 and 124 are fixedly mounted in waveguide 114, and filter cell 118 and tuning disk 164 are movably mounted in waveguide 114 to allow movement thereof along the optical axis, Z.

Although the present invention has been described with reference to preferred embodiments, persons skilled in the art will recognize that changes may be made in form and detail without departing from the spirit and scope of the invention. For example, if a laser is used as a light source, an isotope of cesium, Cs-133, can be used as the absorption material in the absorption cell, and the filter cell can be eliminated. Also, glass other than Corning 1720 and 1724 can be used in the construction of the absorption cell and/or the filter cell, provided that each cell window thickness is adjusted to produce the desired dielectric loading of the dielectric resonator, and glass other than Corning 8161 and materials such as a substantially transparent crystalline material can be used for the dielectric resonator, provided that the substitute glass or material has a substantially equivalent dielectric constant and exhibits low electrical loss. The dielectric resonator may also be constructed of materials having higher electrical loss than that of Corning 8161 glass, provided that the microwave excitation energy supplied to the dielectric resonator is adjusted to a level capable of causing the dielectric resonator to generate an evanescent electromagnetic field at the appropriate amplitude for interrogating atoms in the absorption cell.

I claim:

1. In an atomic frequency standard having a light source for supplying light energy at a frequency useful in optically effecting energy level transitions of atoms, an apparatus comprising:
   an absorption cell containing a first volume of atoms for varying an intensity of the useful light energy passing therethrough;
   a dielectric resonator for generating an evanescent electromagnetic field that effects hyperfine energy level transitions of said first volume of atoms;
   a waveguide, electrically open-ended on at least one end, for housing said absorption cell and said dielectric resonator;
   a photo detector mounted near an end of said waveguide for receiving said light energy; and
   an electromagnetic energy injector for electromagnetically exciting said dielectric resonator.

2. The apparatus of claim 1 wherein said dielectric resonator is a dielectric material transparent to the useful light from said light source.

3. The apparatus of claim 2 wherein said dielectric resonator is shaped as a circular disk.

4. The apparatus of claim 3 wherein said dielectric resonator has a Q greater than or equal to 100.

5. The apparatus of claim 2 wherein said dielectric material comprises glass having a Q greater than or equal to 100.

6. The apparatus of claim 1, and further comprising a filter cell containing a second volume of atoms positioned adjacent to said dielectric resonator.

7. The apparatus of claim 6 wherein said first volume of atoms comprises Rb-87 atoms and said second volume of atoms comprises Rb-85 atoms.

8. The apparatus of claim 6, wherein said filter cell includes a dielectric window and can be varied in distance from said dielectric resonator to tune the resonant frequency of said dielectric resonator.

9. The apparatus of claim 1 wherein said absorption cell further contains a buffer gas.

10. The apparatus of claim 1 further comprising a dielectric disk which is movably carried within said waveguide near said dielectric resonator and can be varied in distance from said dielectric resonator to tune the resonant frequency of said dielectric resonator.

11. The apparatus of claim 1 wherein said absorption cell contains a mixture of Rb-85 atoms and Rb-87 atoms, said Rb-85 atoms providing optical filtering of said light energy passing therethrough.

12. The apparatus of claim 1 wherein said absorption cell and said dielectric resonator are combined to form an integral unit with said dielectric resonator positioned to provide a window of said absorption cell.

13. The apparatus of claim 12 wherein said integral unit further contains atoms to provide optical filtering of said light energy and transitions between hyperfine energy levels from the unfiltered light energy.

14. The apparatus of claim 1, wherein a vapor density of said first volume of atoms is altered by the addition to said absorption cell of one or more elements of a group consisting of alkali-metals.

15. The apparatus of claim 1 wherein said first volume of atoms comprises Cs-133.

16. An atomic frequency standard apparatus, comprising:
   a light source for supplying light energy;
   a photo detector having a photosensitive surface for receiving said light energy and for producing a signal related to an intensity of light energy incident on said photosensitive surface;
   an absorption cell between said light source and said photo detector containing atoms for affecting said intensity of light energy incident on said photosensitive surface;
   a dielectric resonator positioned adjacent to said absorption cell for generating an evanescent electromagnetic field at an atomic transition frequency for effecting hyperfine energy level transitions of atoms in said absorption cell;
   a waveguide electrically open-ended on at least one end having an electrically conductive inner surface and housing said dielectric resonator and absorption cell;
   means for electromagnetically exciting said dielectric resonator; and
   means connected with said photo detector signal for outputting a standard frequency signal related to said atomic transition frequency.

17. The apparatus of claim 16 further comprising a filter cell for removing an unwanted frequency of light energy located between said light source and said absorption cell.

18. The apparatus of claim 17 wherein said filter cell and said absorption cell each comprise a glass enclosure containing atoms of a different rubidium isotope.

19. The apparatus of claim 18 wherein said substance in said filter cell comprises Rb-85 and said substance in said absorption cell comprises Rb-87.

20. The apparatus of claim 18 further comprising heating means for heating said filter cell and said absorption cell to a temperature sufficient to provide an adequate vapor density of said rubidium isotope.

21. The apparatus of claim 20 wherein said heating means comprises a transistor coupled to a surface of said waveguide.

22. The apparatus of claim 17 wherein said waveguide permits the distance between said dielectric resonator and said filter cell to be varied to affect a resonant frequency of said dielectric resonator.

23. The apparatus of claim 16 wherein said dielectric resonator comprises a transparent dielectric disk.

24. The apparatus of claim 23 wherein said dielectric resonator has a quality factor of at least 100.

25. The apparatus of claim 16 wherein said dielectric resonator comprises a material which is transparent to a useful wavelength of said light energy.

26. The apparatus of claim 16 wherein said waveguide houses and structurally supports said dielectric resonator and said absorption cell.

27. The apparatus of claim 16 wherein said waveguide comprises a cylindrical tube.

28. The apparatus of claim 16 wherein said absorption cell and said dielectric resonator are combined to form an integral unit.

29. The apparatus of claim 16 wherein said dielectric resonator forms a transparent window of said absorption cell.

30. An atomic frequency standard apparatus comprising:

a light source for supplying light energy;

a photo detector having a photosensitive surface for receiving said light energy and for producing a signal related to an intensity of light energy incident on said photosensitive surface;

an absorption cell between said light source and said photo detector containing atoms for affecting said intensity of light energy incident on said photosensitive surface;

a transparent dielectric resonator disk positioned adjacent to said absorption cell for generating an evanescent electromagnetic field at an atomic transition frequency for effecting hyperfine energy level transitions of atoms in said absorption cell, wherein a plurality of dimensions of said dielectric resonator disk is selected to create a resonant frequency of said dielectric resonator about equal to said atomic transition frequency;

a waveguide having an electrically conductive inner surface and housing said dielectric resonator disk and absorption cell;

means for electromagnetically exciting said dielectric resonator disk; and means connected with said photo detector signal for outputting a standard frequency signal related to said atomic transition frequency.

31. The apparatus of claim 30 wherein said dielectric resonator disk comprises Corning 8161 glass.

32. The apparatus of claim 31 wherein said glass dielectric resonator disk is resonant at about 6.834 GHz.

33. An atomic frequency standard apparatus, comprising:

a light source for supplying light energy;

a photo detector having a photosensitive surface for receiving said light energy and for producing a signal related to an intensity of light energy incident on said photosensitive surface;

an absorption cell between said light source and said photo detector containing atoms for affecting said intensity of light energy incident on said photosensitive surface;

a dielectric resonator positioned adjacent to said absorption cell for generating an evanescent electromagnetic field at an atomic transition frequency for effecting hyperfine energy level transitions of atoms in said absorption cell;

a waveguide comprising a cylindrical tube, wherein the dimensions of said waveguide are selected so that the waveguide operates at the atomic transition frequency in a TE-11 mode below the cutoff frequency;

means for electromagnetically exciting said dielectric resonator; and means connected with said photo detector signal for outputting a standard frequency signal related to said atomic transition frequency.

34. An atomic frequency standard apparatus, comprising:

an omnidirectional light source for supplying incoherent light energy;

a photo detector having a photosensitive surface for receiving said incoherent light energy and for producing a signal related to an intensity of said incoherent light energy incident on said photosensitive surface;

an absorption cell containing atoms for affecting said intensity of said incoherent light energy incident on said photosensitive surface;

a dielectric resonator positioned adjacent to said absorption cell for generating an evanescent electromagnetic field at an atomic transition frequency for effecting hyperfine energy level transitions of atoms in said absorption cell;

an electrically open-ended tubular waveguide located to collect said incoherent light, and carrying said dielectric resonator and said absorption cell;

means for electromagnetically exciting said dielectric resonator; and means for outputting a standard frequency signal controlled by said atomic transition frequency.

35. The apparatus of claim 34 wherein said electrically open-ended tubular waveguide structurally supports a filter cell located between an open end of the waveguide and the absorption cell.

36. The apparatus of claim 35 wherein said filter cell is located adjacent to said dielectric resonator and said electrically open-ended tubular waveguide and permits the distance between said dielectric resonator and said filter cell to be varied to affect a resonant frequency of said dielectric resonator.

37. The apparatus of claim 35 wherein said filter cell and said absorption cell each comprise a glass enclosure containing a substance for affecting an intensity of said incoherent light energy passing therethrough.

38. The apparatus of claim 37 wherein said substance in said filter glass cell comprises Rb-85 and said substance in said absorption glass cell comprises Rb-87.

39. The apparatus of claim 34 further comprising a dielectric disk movably positioned near said dielectric resonator which can be varied in distance from said dielectric resonator to tune the resonant frequency of said dielectric resonator.

40. The apparatus of claim 34 wherein the dimensions of said electrically open-ended tubular waveguide are selected so that said apparatus operates at the atomic transition frequency in a TE-11 mode below the cutoff frequency.

41. The apparatus of claim 34 further comprising a substantially transparent cover positioned over an open end of said electrically open-ended tubular waveguide for reducing temperature gradients in said absorption cell.

42. The apparatus of claim 34 wherein said dielectric resonator comprises a transparent dielectric disk.

43. The apparatus of claim 42 wherein a plurality of dimensions of said dielectric disk is selected to create a resonant frequency of said dielectric resonator about equal to an atomic transition frequency.

44. The apparatus of claim 43 wherein said dielectric disk comprises Corning 8161 glass.

45. The apparatus of claim 44 wherein said glass dielectric disk is capable of being resonant at 6.834 GHz.

46. The apparatus of claim 42 wherein said dielectric disk comprises a substantially transparent crystalline material.

47. The apparatus of claim 34 wherein said dielectric resonator comprises a material which is transparent to a wavelength of said incoherent light energy at said atomic transition frequency.

48. A method for generating a standard frequency, comprising the steps of:
   providing a volume of atoms capable of having a plurality of hyperfine energy levels;
   generating light energy and directing said light energy to said volume of atoms;
   providing a waveguide electrically open-ended on at least one end;
   positioning said volume of atoms and a dielectric resonator in said waveguide;
   exciting said dielectric resonator;
   generating an evanescent electromagnetic field with the excited dielectric resonator;
   introducing said evanescent electromagnetic field into said volume of atoms causing hyperfine energy level transitions of atoms to affect an intensity of light energy directed at and transmitted through said volume of atoms; and
   effecting a current output of a photo detector in relation to the intensity of light energy transmitted through said volume of atoms.

49. The method of claim 48 further comprising the step of filtering said light energy for removing a predetermined frequency of said light energy.

50. The method of claim 48 wherein said exciting step further comprises the steps of:
   supplying said current output from said photo detector to a voltage controlled crystal oscillator via a servo electronics package;
   generating a standard output frequency by said voltage controlled crystal oscillator; and
   supplying said standard output frequency to a frequency multiplier which generates a signal to effect the excitation of said dielectric resonator.

51. The method of claim 48 wherein said dielectric resonator comprises a substantially transparent crystalline material.

52. A method of claim 48 further comprising the steps of:
   providing said excited dielectric resonator adjacent to said volume of atoms to cause said volume of atoms to undergo hyperfine energy level transitions;
   positioning a dielectric disk adjacent said dielectric resonator; and
   adjusting the distance between said dielectric resonator and said dielectric disk to adjust the resonant frequency of said dielectric resonator.

53. An atomic frequency standard apparatus, comprising:
   an omnidirectional light source for supplying incoherent light energy;
   a photo detector having a photosensitive surface for receiving said incoherent light energy and for producing a signal related to an intensity of said incoherent light energy incident on said photosensitive surface;
   an absorption cell containing atoms for affecting said intensity of said incoherent light energy incident on said photosensitive surface:
   a dielectric resonator positioned adjacent to said absorption cell for generating an evanescent electromagnetic field at an atomic transition frequency for effecting hyperfine energy level transitions of atoms in said absorption cell;
   an electrically open-ended tubular waveguide located to collect said incoherent light and carrying said dielectric resonator and said absorption cell;
   means for electromagnetically exciting said dielectric resonator; and
   means for outputting a standard frequency signal controlled by said atomic transition frequency, wherein said electrically open-ended tubular waveguide structural supports a filter cell located between an open end of the waveguide and the absorption cell, and
   wherein tuning of said apparatus is effected by adjusting the distance between said filter cell and said dielectric resonator to affect a resonant frequency of said dielectric resonator.

54. A method of tuning a resonant frequency of an electromagnetic field generated in an atomic frequency standard, comprising the steps of:
   providing a dielectric resonator adjacent to a volume of atoms, said dielectric resonator being capable of causing said volume of atoms to undergo hyperfine energy level transitions;
   positioning said dielectric resonator between said volume of atoms and a filter cell; and
   adjusting the distance between said dielectric resonator and said filter cell to adjust the resonant frequency of said dielectric resonator.

55. The method of claim 54 wherein said dielectric resonator comprises a glass disk.

56. A physics package assembly for an atomic frequency standard, comprising:
   an electrically open-ended waveguide with one end of said electrically open-ended waveguide coupled with a photo detector and the other end adapted to accept light energy;
   an absorption cell carried within and by said waveguide and containing atoms capable of varying the intensity of light energy directed through the absorption cell;
   a dielectric resonator carried within and by said waveguide adjacent said absorption cell for generating an evanescent electromagnetic field extending into the atoms of said absorption cell; and
   means for electromagnetically exciting said dielectric resonator within said open-ended waveguide.

57. The apparatus of claim 56 further comprising a dielectric tuning member movably carried within said electrically open-ended waveguide adjacent to said dielectric resonator so that movement of said dielectric tuning member will tune the resonant frequency at said dielectric resonator.

58. The apparatus of claim 57 wherein said dielectric tuning member comprises one window of a filter cell movably carried within said electrically open-ended waveguide.

59. In an atomic frequency standard having a light source for supplying light energy at a wavelength useful in optically effecting energy level transitions of atoms housed in an absorption cell, the improvement comprising a waveguide for containing microwave energy, electrically open-ended on at least one end, with said absorption cell being carried within said waveguide to receive light energy traveling through said one end of said waveguide.

60. The atomic frequency standard of claim 59, wherein the dimensions of said waveguide are selected so that said waveguide operates in a TE-11 mode.

61. The atomic frequency standard of claim 59, wherein the dimensions of said waveguide are selected so that said waveguide operates at an atomic transition frequency and below a cut-off frequency.

62. The atomic frequency standard of claim 61, wherein said waveguide operates in a TE-11 mode.

63. The atomic frequency standard of claim 59, wherein said waveguide comprises a cylindrical tube.

64. The atomic frequency standard of claim 63, wherein said one end of said cylindrical tube is electrically open-ended so as to form an opening substantially equal to an inside diameter of said cylindrical tube so that said waveguide receives therein a maximum quantity of the light directed toward said one end, and wherein said cylindrical tube is electrically closed at the other end by the presence of a photodetector.

65. The atomic frequency standard of claim 59, further comprising a dielectric resonator positioned in said waveguide.

66. The atomic frequency standard of claim 65 further comprising a filter cell positioned in said waveguide near said dielectric resonator, wherein a resonant frequency of said dielectric resonator is adjusted by varying the distance between said filter cell and said dielectric resonator.

67. The atomic frequency standard of claim 65, further comprising a filter cell slidably positioned in said waveguide near said dielectric resonator for tuning the resonant frequency of said dielectric resonator.

68. In an atomic frequency standard having a light source for employing light energy at a wavelength useful in optically affecting energy level transitions of atoms, an apparatus comprising:

an absorption cell containing a volume of atoms capable of varying the intensity of the useful light energy;

a waveguide, electrically open-ended on at least one end, providing microwave energy within and allowing the light energy to pass through said absorption cell; and a photodetector positioned to receive light energy passing through said absorption cell.

69. The atomic frequency standard of claim 68, wherein the dimensions of said waveguide are selected so that said waveguide operates in a TE-11 mode.

70. The atomic frequency standard of claim 68, wherein the dimensions of said waveguide are selected so that said waveguide operates at an atomic transition frequency and below a cut-off frequency.

71. The atomic frequency standard of claim 70, wherein said waveguide operates in a TE-11 mode.

72. The apparatus of claim 68, wherein said waveguide comprises a cylindrical tube.

73. The apparatus of claim 72, wherein said one end of said cylindrical tube is electrically open-ended so as to form an opening substantially equal to an inside diameter of said cylindrical tube so that said waveguide receives therein a maximum quantity of the light directed toward said one end, and wherein the other end of said said cylindrical tube is electrically closed by the presence of a photodetector.

74. The apparatus of claim 68, further comprising a dielectric resonator positioned in said waveguide.

75. The atomic frequency standard of claim 74 further comprising a filter cell positioned in said waveguide near said dielectric resonator, wherein a resonant frequency of said dielectric resonator is adjusted by varying the distance between said filter cell and said dielectric resonator.

76. The atomic frequency standard of claim 74, further comprising a filter cell slidably positioned in said waveguide near said dielectric resonator for tuning the resonant frequency of said dielectric resonator.

77. In an atomic frequency standard in which light energy effects atomic frequency transitions in an absorption cell which are detected with the use of microwave energy, the improvement comprising a waveguide, electrically open-ended on at least one end, for providing both microwave energy and light energy to said absorption cell.

78. In an atomic frequency standard in which light energy effects atomic frequency transitions of atoms in an absorption cell that are detectable through the use of microwave energy, the improvement comprising an electrically open-ended waveguide for carrying said atoms and for providing both microwave energy and light energy thereto.

\* \* \* \* \*

UNITED STATES PATENT AND TRADEMARK OFFICE
CERTIFICATE OF CORRECTION

PATENT NO. : 5,517,157

DATED : May 14, 1996

INVENTOR(S) : Thomas C. English

It is certified that error appears in the above-indentified patent and that said Letters Patent is hereby corrected as shown below:

In Col. 26, lines 11-12, delete "structural" and insert --structurally--.

Signed and Sealed this

Twenty-eighth Day of January, 1997

Attest:

BRUCE LEHMAN

*Attesting Officer*     *Commissioner of Patents and Trademarks*